United States Patent
Chehade et al.

(10) Patent No.: US 12,029,010 B2
(45) Date of Patent: Jul. 2, 2024

(54) WATER BLOCK HAVING HOLLOW FINS

(71) Applicant: OVH, Roubaix (FR)

(72) Inventors: Ali Chehade, Moncheaux (FR); Anas Chakir, Rollegem (BE); Hadrien Bauduin, Villeneuve d'Ascq (FR)

(73) Assignee: OVH, Roubaix (FR)

( * ) Notice: Subject to any disclaimer, the term of this patent is extended or adjusted under 35 U.S.C. 154(b) by 123 days.

(21) Appl. No.: 17/677,176

(22) Filed: Feb. 22, 2022

(65) Prior Publication Data

US 2022/0279679 A1 Sep. 1, 2022

(30) Foreign Application Priority Data

Feb. 26, 2021 (EP) ..................................... 21305237
May 28, 2021 (EP) ..................................... 21305717

(51) Int. Cl.
*H01L 23/473* (2006.01)
*F28F 3/04* (2006.01)
(Continued)

(52) U.S. Cl.
CPC ......... *H05K 7/20272* (2013.01); *F28F 3/048* (2013.01); *F28F 23/00* (2013.01);
(Continued)

(58) Field of Classification Search
CPC .. F28F 2215/06; H01L 23/40; H01L 23/4006; H01L 23/467; H01L 23/471
See application file for complete search history.

(56) References Cited

U.S. PATENT DOCUMENTS 5,002,123 A * 3/1991 Nelson .................... F28F 13/08
257/E23.098
5,316,077 A * 5/1994 Reichard .................. F28F 3/12
257/E23.098
(Continued)

FOREIGN PATENT DOCUMENTS

CN 2720630 Y 8/2005
CN 106469696 A 3/2017
(Continued)

OTHER PUBLICATIONS

Extended European Search Report with regard to the EP Patent Application No. 21305717_7 completed Nov. 10, 2021.
(Continued)

*Primary Examiner* — Frantz F Jules
*Assistant Examiner* — Jason N Thompson
(74) *Attorney, Agent, or Firm* — BCF LLP

(57) ABSTRACT

A water block for cooling a heat-generating component has a body defining an internal fluid conduit for circulating fluid within the water block. The body defines a fluid inlet and a fluid outlet for feeding fluid into and discharging fluid from the internal fluid conduit respectively. The body includes: an external thermal transfer surface configured to be in contact with the heat-generating component; an opposite external surface on an opposite side of the body from the external thermal transfer surface; and at least one hollow fin extending from the opposite external surface, the at least one hollow fin defining at least one external fin passage, each of the at least one hollow fin defining an internal fin recess that forms part of the internal fluid conduit of the water block.

14 Claims, 27 Drawing Sheets

(51) Int. Cl.
  *F28F 23/00* (2006.01)
  *H01L 23/40* (2006.01)
  *H01L 23/467* (2006.01)
  *H05K 7/20* (2006.01)
  *G06F 1/20* (2006.01)

(52) U.S. Cl.
  CPC ...... *H05K 7/20236* (2013.01); *F28F 2250/08* (2013.01); *G06F 1/20* (2013.01)

(56) References Cited

U.S. PATENT DOCUMENTS

| | | | |
|---|---|---|---|
| 7,388,746 | B2 | 6/2008 | Park et al. |
| 8,737,071 | B2 | 5/2014 | Hao et al. |
| 8,944,147 | B2 | 2/2015 | Takano et al. |
| 9,502,329 | B2 | 11/2016 | Nagaune |
| 9,845,999 | B2 | 12/2017 | Matsushima et al. |
| 10,327,355 | B2 | 6/2019 | Lin |
| 10,410,954 | B2 | 9/2019 | Sun et al. |
| 10,553,522 | B1 | 2/2020 | Canaperi et al. |
| 10,743,438 | B2* | 8/2020 | Wakino ............ H05K 7/20272 |
| 10,747,276 | B2 | 8/2020 | Chen |
| 10,809,776 | B2 | 10/2020 | Lee |
| 11,094,611 | B2 | 8/2021 | Zhong et al. |
| 2002/0056908 | A1 | 5/2002 | Brownell et al. |
| 2003/0150599 | A1* | 8/2003 | Suzuki ................ F28F 9/0278 165/104.21 |
| 2004/0190251 | A1 | 9/2004 | Prasher et al. |
| 2004/0190253 | A1 | 9/2004 | Prasher et al. |
| 2005/0039884 | A1* | 2/2005 | Pawlenko ................. F28F 3/02 257/E23.091 |
| 2005/0117300 | A1* | 6/2005 | Prasher ................ H01L 23/427 361/699 |
| 2006/0162899 | A1* | 7/2006 | Huang ................ H01L 23/467 257/E23.098 |
| 2006/0237167 | A1* | 10/2006 | Lee ...................... F28D 15/046 165/104.26 |
| 2007/0025085 | A1 | 2/2007 | Chang |
| 2007/0227703 | A1 | 10/2007 | Bhatti et al. |
| 2007/0258213 | A1 | 11/2007 | Chen et al. |
| 2007/0258216 | A1* | 11/2007 | McBain ............ H05K 7/20254 361/707 |
| 2008/0024990 | A1* | 1/2008 | Peng ..................... H01L 23/473 361/699 |
| 2008/0029244 | A1* | 2/2008 | Gilliland ............... H01L 23/473 257/E23.098 |
| 2011/0079376 | A1 | 4/2011 | Loong et al. |
| 2012/0160466 | A1* | 6/2012 | Pollard ..................... F28F 3/02 165/185 |
| 2014/0119393 | A1* | 5/2014 | Schleuning .......... H01S 5/02476 372/36 |
| 2014/0262186 | A1* | 9/2014 | Kandlikar ............ H01L 23/473 165/177 |
| 2015/0153116 | A1* | 6/2015 | Sekiguchi ............ H01L 23/473 165/172 |
| 2017/0115071 | A1 | 4/2017 | Lin |
| 2017/0287809 | A1 | 10/2017 | Schultz |
| 2018/0308780 | A1* | 10/2018 | Tong .................. H01L 23/3733 |
| 2019/0033930 | A1 | 1/2019 | Rupprecht |
| 2019/0041105 | A1 | 2/2019 | Yin |
| 2019/0307020 | A1 | 10/2019 | Nakae et al. |
| 2019/0383559 | A1* | 12/2019 | Aoki ................... F28D 1/05316 |
| 2020/0149830 | A1 | 5/2020 | Lin |
| 2020/0373223 | A1 | 11/2020 | Chehade et al. |
| 2022/0029873 | A1* | 1/2022 | Doukopoulos ...... H04B 1/1027 |
| 2022/0205723 | A1* | 6/2022 | Chen ...................... F28D 1/035 |

FOREIGN PATENT DOCUMENTS

| | | |
|---|---|---|
| DE | 202013001316 U1 | 5/2013 |
| EP | 3089210 A1 | 11/2016 |

OTHER PUBLICATIONS

English Abstract for CN106469696 retrieved on Espacenet on Feb. 16, 2022.
English Abstract for CN2720630 retrieved on Espacenet on Feb. 16, 2022.
English Abstract for DE202013001316 retrieved on Espacenet on Feb. 16, 2022.
Chilldyne Liquid Cooling System Overview, 2019, http://www.chilldyne.com/wp-content/uploads/2019/12/Chilldyne-Liquid-Cooling-System-2019.pdf accessed Feb. 17, 2022, pdf 2 pages.

* cited by examiner

WATER BLOCK HAVING HOLLOW FINS

CROSS-REFERENCE

The present application claims priority from European Patent Application No. EP21305237.6, filed on Feb. 26, 2021, and from European Patent Application No. EP 21305717.7, filed on May 28, 2021, the entirety of both of which is incorporated by reference herein.

FIELD OF TECHNOLOGY

The present technology relates to water blocks.

BACKGROUND

Many components of a computer system, such as a processor (also referred to as central processing unit (CPU)), generate heat and thus require cooling to avoid performance degradation and, in some cases, failure. Moreover, with advancing technological progress, computer components are not only becoming more performant but also have a greater associated thermal design power (TDP) (i.e., a maximum amount of heat generated thereby which a cooling system should dissipate) thus emphasizing the need to improve cooling solutions therefor. Water cooling systems, such as water blocks, are used to locally collect thermal energy from those heat-generating components. Notably, a water block, which is a water cooling heat sink, is thermally coupled to the heat-generating component to be cooled (e.g., the processor) and water, or other heat-transfer fluid, flows through an internal conduit of the water block to collect thermal energy from the heat-generating component. The collected thermal energy may be further directed elsewhere to be dissipated.

However, in some cases, the heat dissipation provided by the water block may not be sufficient. Moreover, water blocks are susceptible to clogging which can negatively affect their heat dissipation performance as water flow is restricted therethrough. For example, limescale deposits can form in a water block's internal conduit or external piping from the accumulation of impurities (e.g., calcium) contained in the water flowing therethrough. If not addressed promptly, this may reduce a cooling efficiency of the water block and cause the heat-generating component to overheat and further lead to a decrease of performance or even failure of the heat-generating component.

There is therefore a desire for a water block which can alleviate at least some of these drawbacks.

SUMMARY

It is an object of the present technology to ameliorate at least some of the inconveniences present in the prior art.

According to one aspect of the present technology, there is provided a water block for cooling a heat-generating component, the water block comprising: a body defining an internal fluid conduit for circulating fluid within the water block, the body defining a fluid inlet and a fluid outlet for feeding fluid into and discharging fluid from the internal fluid conduit respectively, the body comprising: an external thermal transfer surface configured to be in contact with the heat-generating component; an opposite external surface on an opposite side of the body from the external thermal transfer surface; and at least one hollow fin extending from the opposite external surface, the at least one hollow fin defining at least one external fin passage, each of the at least one hollow fin defining an internal fin recess that forms part of the internal fluid conduit of the water block.

In some embodiments, the body comprises a base portion and a cover portion affixed to one another, the base portion and the cover portion defining together the internal fluid conduit; the base portion comprises the external thermal transfer surface; and the cover portion comprises the opposite external surface.

In some embodiments, the internal fluid conduit comprises a lower fluid conduit portion disposed between the external thermal transfer surface and the opposite external surface, the lower fluid conduit portion defining a path of the internal fluid conduit between the fluid inlet and the fluid outlet; and each hollow fin of the plurality of hollow fins extends above a corresponding part of the lower fluid conduit portion such that the internal fin recess of the hollow fin is aligned with the corresponding part of the lower fluid conduit portion.

In some embodiments, the at least one hollow fin includes a plurality of hollow fins; the hollow fins are generally parallel to one another and are spaced apart from one another, the external fin passages being defined between consecutive ones of the hollow fins.

In some embodiments, a cross-sectional profile of each hollow fin, taken along a plane normal to a length of the hollow fin, is generally rectangular.

In some embodiments, the hollow fins are configured to be in thermal contact with an external fluid to transfer heat from the heat transfer fluid circulating in the internal fluid conduit to the external fluid.

In some embodiments, each hollow fin of the plurality of hollow fins extends, in a height direction, from the opposite external surface to an upper end of the hollow fin; the water block further comprises a fin cover interconnecting the upper ends of the hollow fins; and each of the fin passages is defined between two consecutive ones of the hollow fins, the opposite external surface and the fin cover.

In some embodiments, the fin cover extends generally parallel to the opposite external surface.

In some embodiments, each hollow fin of the plurality of hollow fins has a length measured from a first longitudinal end to a second longitudinal end thereof; and the length of each hollow fin corresponds to at least a majority of a length of the body.

In some embodiments, each hollow fin of the plurality of hollow fins has a length measured from a first longitudinal end to a second longitudinal end thereof; and the fin recess of each hollow fin of the plurality of hollow fins extends along at least a majority of the length thereof.

In some embodiments, the water block is comprised in a heat transfer system for cooling a heat-generating component, the internal fluid conduit of the water block being configured to circulate a first heat transfer fluid therein, the heat transfer system further comprising an immersion cooling tank containing the water block therein, the immersion cooling tank being configured to contain a second heat transfer fluid therein such that, in use, the water block is immersed in the second heat transfer fluid such that the second heat transfer fluid flows between the hollow fins of the water block.

In some embodiments, the first heat transfer fluid is water and the second heat transfer fluid is a dielectric liquid.

According to another aspect of the present technology, there is provided a method of installing a heat transfer system for cooling a heat-generating component, the method comprising: providing an immersion cooling tank; installing a water block on the heat-generating component, the water block comprising at least one hollow fin, each of the at least one hollow fin defining an internal fin recess forming part of an internal fluid conduit defined by the water block; placing the heat-generating component in the immersion cooling tank; pumping a first heat transfer fluid through the internal fluid conduit defined by the water block; and filling the immersion cooling tank with a second heat transfer fluid such that the second heat transfer fluid flows within at least one external fin passage defined by at least one hollow fin thereby transferring thermal energy from the first heat transfer fluid circulating in the internal fin recess of the at least one hollow fin to the second heat transfer fluid.

In some embodiments, the first heat transfer fluid is water.

In some embodiments, the heat-generating component is placed in the immersion cooling tank such that the at least one hollow fin of the water block extends generally vertically.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
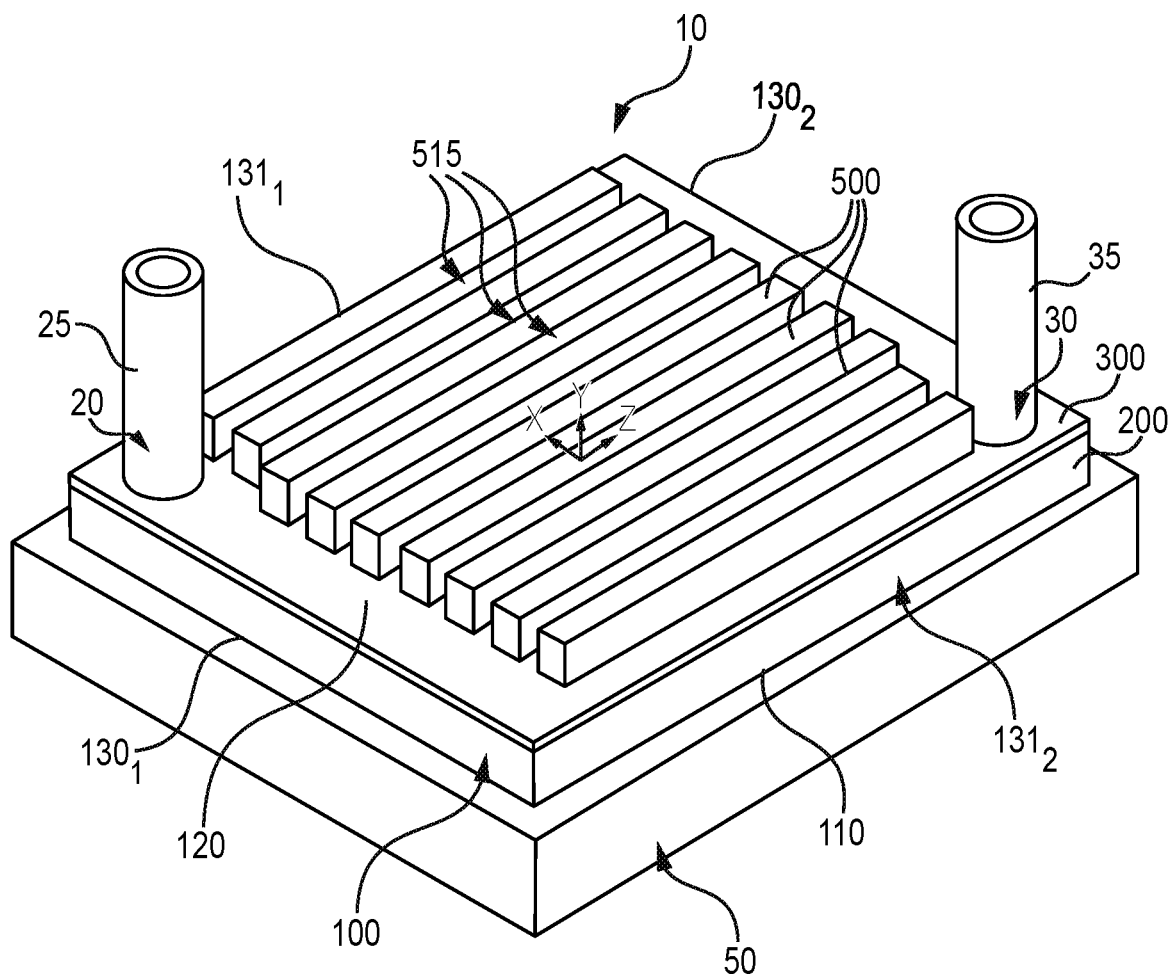
FIG. 1 is a perspective view of a water block according to an embodiment of the present technology.
Figure 2:
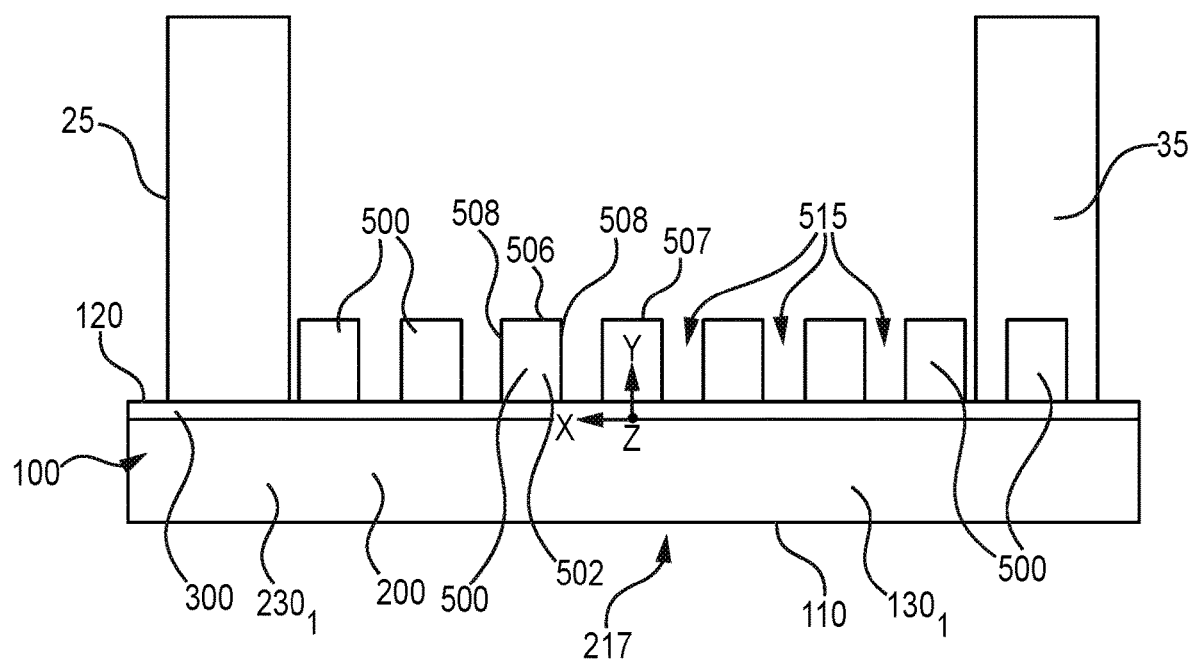
FIG. 2 is a front elevation view of the water block of FIG. 1.
Figure 3:
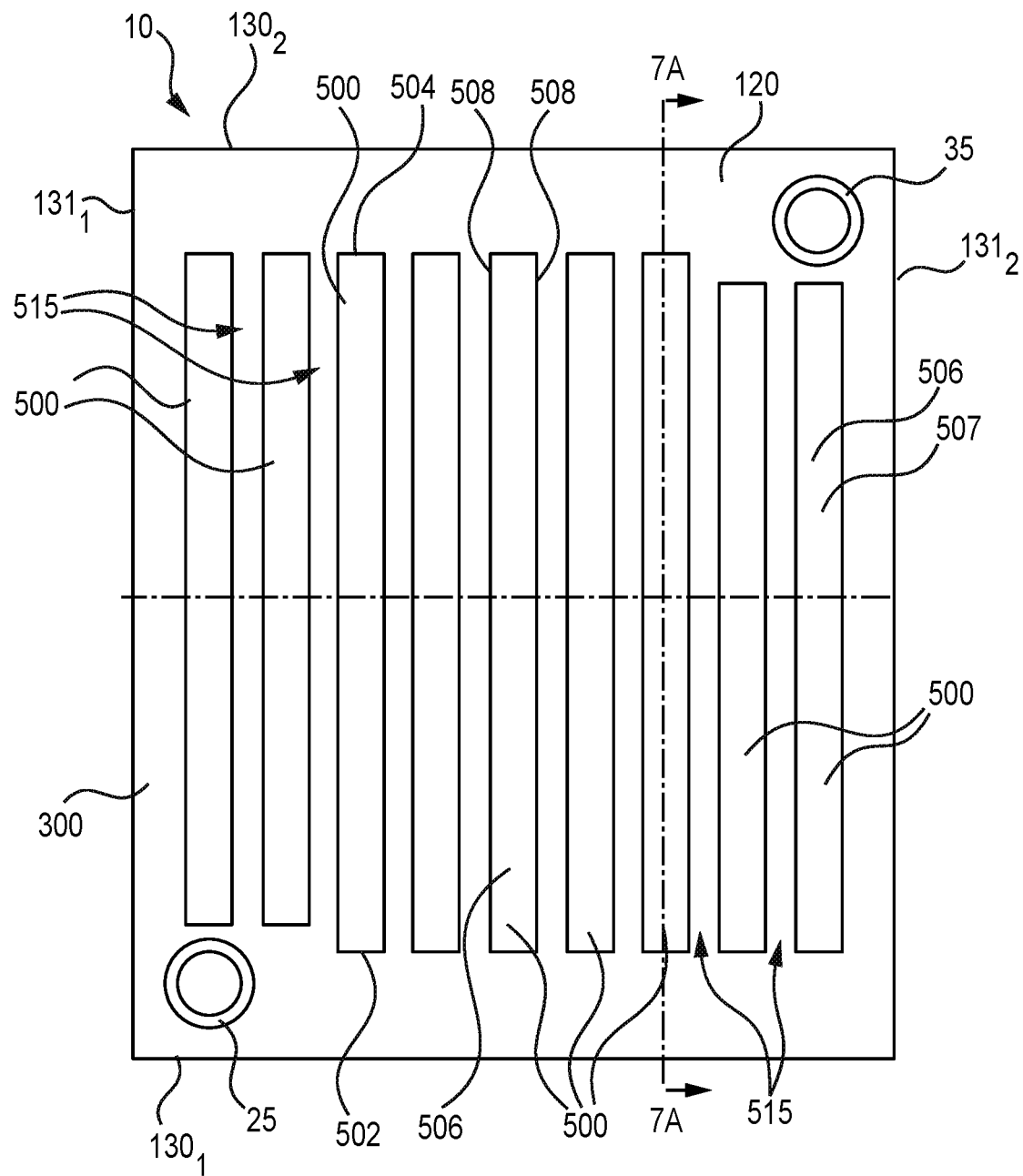
FIG. 3 is a top plan view of the water block of FIG. 1.

FIGS. 1 to 3 illustrate a water block 10 in accordance with an embodiment of the present technology. As shown in FIG.

1, the water block 10 is configured for cooling a heat-generating component 50. In this example, the heat-generating component 50 is a central processing unit (CPU) of a computer system and is mounted to a motherboard thereof. In use, the CPU 50 generates a significant amount of heat and, as is known, can benefit from cooling. It is contemplated that the heat-generating component 50 could be any other suitable heat-generating electronic component (e.g., a graphics processing unit (GPU)) or an intermediary component disposed between the water block 10 and a heat-generating component. It is contemplated that a liquid (e.g., a refrigerant, a dielectric fluid or any fluid suitable for heat transfer purposes) other than water could be used in the water block 10 in other embodiments. As such, it is to be understood that the term "water block" is intended to include such water blocks that use fluids other than water and/or multiphase flow (e.g., two-phase flow). For example, in some instance, the fluid may be an oil, an alcohol, or a dielectric fluid (e.g., 3M Novec®).

In use, the water block 10 is disposed atop the heat-generating component 50 and is in thermal contact with the heat-generating component 50 such as to allow the water block 10 to absorb heat therefrom. More precisely, a body 100 of the water block 10 defines an internal fluid conduit 15 (shown in part in FIG. 2) for circulating heat transfer fluid therein. The body 100 also defines a fluid inlet 20 and a fluid outlet 30 for feeding and discharging the heat transfer fluid from the internal fluid conduit 15 respectively. In this embodiment, an inlet pipe 25 is connected to the fluid inlet 20, while an outlet pipe 35 is connected to the fluid outlet 30. In other embodiments, respective inlet and outlet connectors may be fluidly connected between the pipes 25, 35 and the fluid inlet and outlet 20, 30.

In this embodiment, the body 100 comprises an external thermal transfer surface 110 on a first side of the water block 10 configured to be in contact with the heat-generating component 50. It is to be understood that in this context, the external thermal transfer surface 110 is said to be "in contact" with the heat-generating component 50 even in cases where a thermal paste is applied between the external thermal transfer surface 110 and the heat-generating component 50, in a manner that is known in the art, to ensure adequate heat transfer between the heat-generating component 50 and the external thermal transfer surface 110.

The body 100 also comprises an upper external surface 120 on an opposite side of the body 100 from the external thermal transfer surface 110. The upper external surface 120 may thus be referred to as the "opposite external surface". The upper external surface 120 is generally parallel to the external thermal transfer surface 110 and faces in a direction opposite thereof. As will be described in detail further below, the water block 10 comprises a plurality of hollow fins 500 extending from the upper external surface 120 and defining in part the internal fluid conduit 15. As such, the heat transfer fluid circulating through the water block 10 (e.g., water) flows within the hollow fins 500 to provide improved heat dissipation with an external environment of the water block 10. Moreover, the hollow fins 500 can be useful to provide a level of redundancy to the water block 10.

With reference to FIGS. 1 and 2, in this embodiment, the water block 10 is generally rectangular and has front and rear longitudinal ends $130_1$, $130_2$, and opposite lateral ends $131_1$, $131_2$. In particular, in this embodiment, the water block 10 has a base portion 200 and a cover portion 300 affixed to the base portion 200 to form the body 100 of the water block 10, including the ends $130_1$, $130_2$, $131_1$, $131_2$ thereof. In use, the base portion 200 is disposed between the cover portion 300 and the heat-generating component 50. The base and cover portions 200, 300 can be affixed to one another in various ways. In this embodiment, the base portion 200 is welded to the cover portion 300 along a seam therebetween. In particular, in this embodiment, the base and cover portions 200, 300 are laser welded to one another.

Other configurations of the water block 10 are contemplated. For instance, the water block 10 may be formed of a mono-block body that may be made via 3D printing. Alternatively, the water block 10 may include additional parts affixed to one another to form the body 100.

In this embodiment, the cover and base portions 200, 300 are made of a thermally conductive material such as metal, for instance copper or aluminum. However, it is contemplated that the base and cover portions 200, 300 could be made from different thermally conductive materials in other embodiments, including combining different materials (e.g., cover portion 300 made from a different material than the base portion 200).

Figure 4:
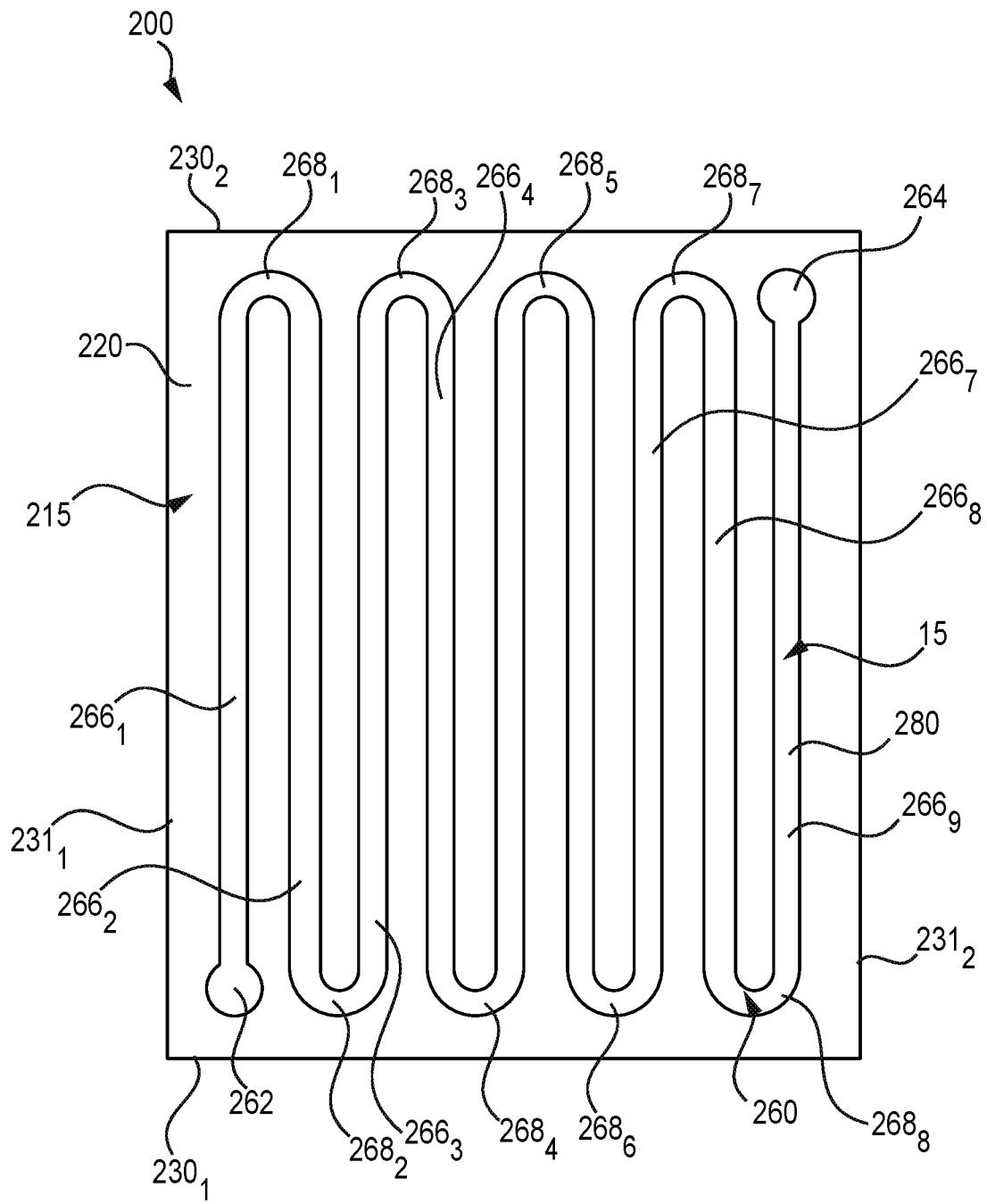
FIG. 4 is a top plan view of a base portion of the water block of FIG. 1.

As shown in FIGS. 2 and 4, the base portion 200 has an upper side 215 (internal side) and a lower side 217 (external side) opposite the upper side 215. The external thermal transfer surface 110 is disposed on the lower side 217 of the base portion 200. An upper surface 220 (FIG. 4) of the base portion 200, on the upper side 215 of the base portion 200, is in contact with the cover portion 300. The upper surface 220 defines a continuous recess 280 extending from a first end 262 to a second end 264. The recess 280 defines a lower fluid conduit portion 260 of the internal fluid conduit 15 such that the first and second ends 262, 264 are the first and second ends of the lower fluid conduit portion 260. Thus, in this embodiment, the lower fluid conduit portion 260 is defined by the base portion 200 as the lower fluid conduit portion 260 is disposed between the external thermal transfer surface 110 and the upper external surface 120.

In this embodiment, the recess 280 is machined into the upper surface 220 of the base portion 200. For example, the recess 280 can be milled into the upper surface 220 by a milling machine (e.g., a numerically controlled mill). The recess 280 may be provided in the base portion 200 in any other suitable way in other embodiments (e.g., molded or machined using electro erosion). In this embodiment, the recess 280 has a height of approximately 4 mm and a width of approximately 2 mm. The dimensions of the recess 280 may be different in other embodiments.

The path described by the lower fluid conduit portion 260, as defined by the recess 280, begins at the first end 262. As shown in FIG. 4, in this embodiment, the lower fluid conduit portion 260 defines a single continuous channel. However, it is contemplated that, in other embodiments, the lower fluid conduit portion 260 could define a plurality of channels. For instance, the lower fluid conduit portion 260 may branch into two parallel micro-channels at the first end 262, or downstream from the first end 262, such that the flow of fluid within the lower fluid conduit portion 260 is split between both channels.

In this embodiment, the lower fluid conduit portion 260 forms a "serpentine" path. In this context, a serpentine path is herein defined as being a path that describes at least one S-shaped curve. More specifically, the lower fluid conduit portion 260 defines a plurality of longitudinally-extending sections $266_1$-$266_9$ that are parallel to one another and are laterally spaced from one another, with adjacent ones of the longitudinally-extending sections $266_1$-$266_9$ being connected by looping sections $268_1$-$268_8$. In this embodiment, the longitudinally-extending sections $266_1$-$266_9$ are elongated. The first end 262 is located at the longitudinally-extending section $266_1$ and the second end 264 is located at the longitudinally-extending section $266_9$ such that the first end 262 and the second end 264 are located at the laterally furthest-most of the longitudinally-extending sections $266_1$-$266_9$ respectively (i.e., the longitudinally-extending sections $266_1$-$266_9$ which are most laterally spaced from one another).

In this embodiment, the first and second ends 262, 264 of the lower fluid conduit portion 260 are located at diagonally opposite corners of the base portion 200. For instance, the first end 262 is located proximate an intersection of a front longitudinal end $230_1$ and a left lateral end $231_1$ of the base portion 200, while the second end 264 is located proximate an intersection of an opposite rear longitudinal end $230_2$ and an opposite right lateral end $231_2$ of the base portion 200. As such, the first and second ends 262, 264 are located proximate opposite longitudinal and lateral sides of the water block 10. Other positions of the first and second ends 262, 264 are contemplated in alternative embodiments. For instance, the first and second ends 262, 264 of the lower fluid conduit portion 260 could be located proximate the same longitudinal end $230_1$, thereby defining an even number of longitudinally-extending sections of the serpentine path.

Figure 12:
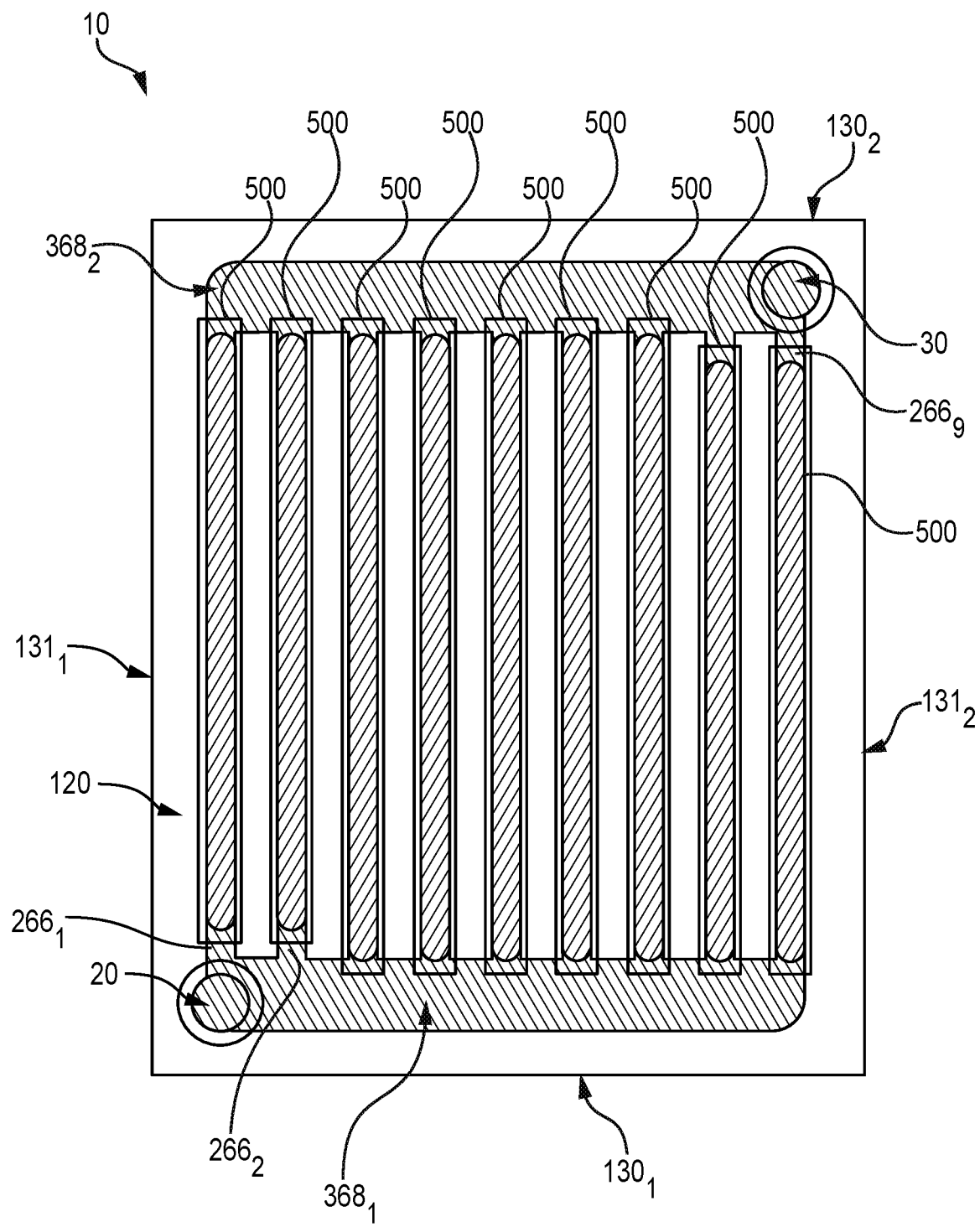
FIG. 12 is a top plan view of the water block according to another alternative embodiment, illustrating the water block translucently to expose the internal fluid conduit.

It is contemplated that the lower fluid conduit portion 260 could describe different paths in other embodiments. For instance, in some embodiments, the lower fluid conduit portion 260 could be shaped such that water flows through the longitudinally-extending sections $266_1$-$266_9$ in parallel rather than consecutively (in series). Notably, with reference to FIG. 12, in some embodiments, the lower fluid conduit portion 260 has front and rear manifold sections $368_1$, $368_2$ extending laterally (i.e., transversally to the longitudinally-extending sections $266_1$-$266_9$), with each of the longitudinally-extending sections $266_1$-$266_9$ opening into both the front and rear manifold sections $368_1$, $368_2$. As can be seen, in this alternative embodiment, the first and second ends 262, 264 of the lower fluid conduit portion 260 are still located at diagonally opposite corners of the base portion 200, with the first end 262 disposed at the front manifold section $368_1$ while the second end 264 is disposed at the rear manifold section $368_2$.

Figure 18:
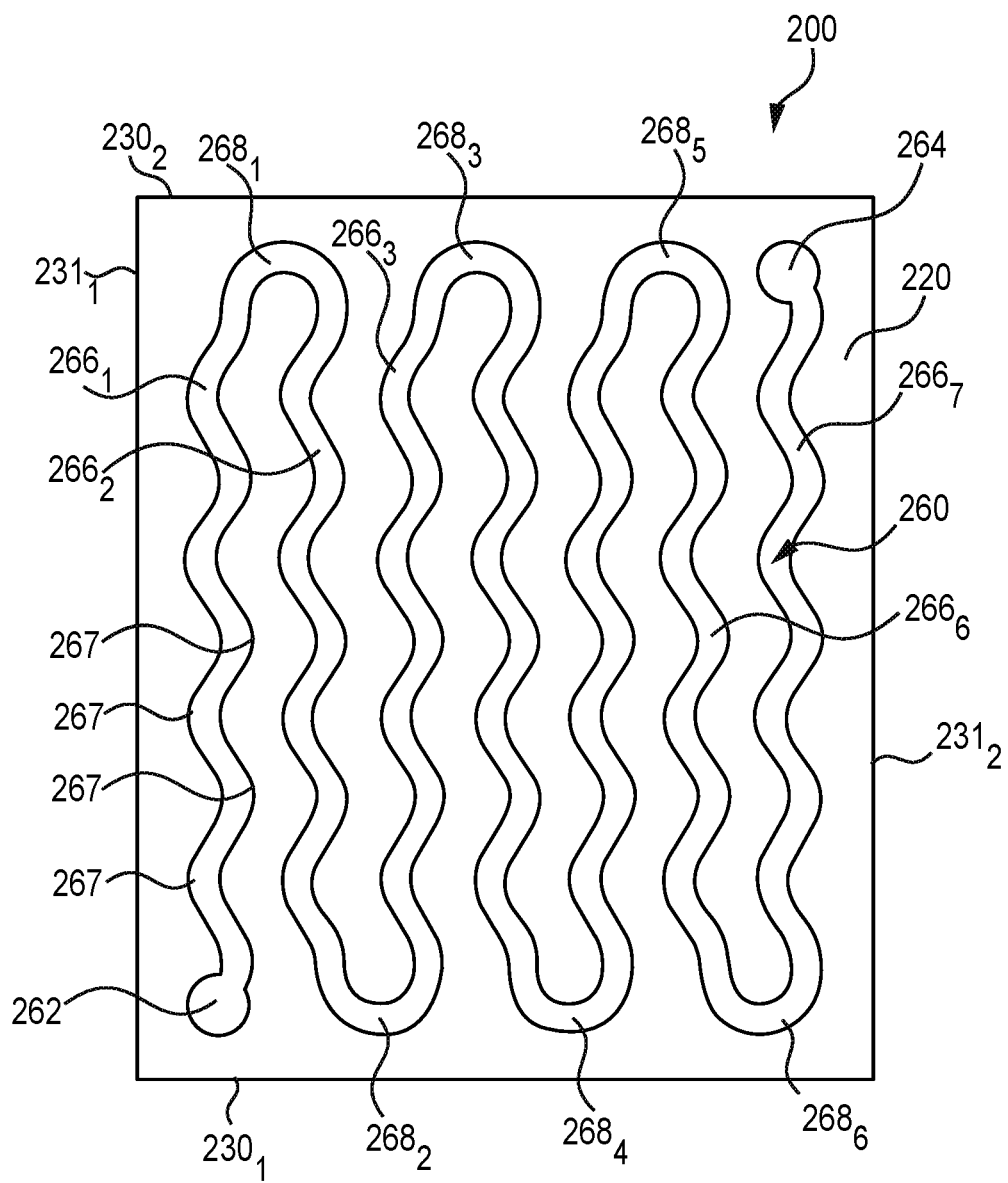
FIG. 18 is a top plan view of the base portion of the water block according to an alternative embodiment.

In another embodiment, as shown in FIG. 18, the lower fluid conduit portion 260 has a generally sinusoidal pattern along at least part thereof. In particular, in the embodiment of FIG. 18, the longitudinally-extending sections $266_1$-$266_7$ are not rectilinear but rather define a sinusoidal pattern along a majority of a length thereof. In other words, each longitudinally-extending section $266_i$ has a repetitive pattern approximating that of a sinusoidal function. Specifically, each longitudinally-extending section $266_i$ has alternatingly-oriented undulations 267 deviating from a linear axis extending between opposite ends of the longitudinally-extending section $266_i$. The sinusoidal pattern of the lower fluid conduit portion 260 provides a greater surface area for heat exchange between the fluid flowing in the lower fluid conduit portion 260 and the water block 10. The sinusoidal pattern of the lower fluid conduit portion 260 aims to provide flow disturbances to enhance heat exchange between the fluid flowing in the lower fluid conduit portion 260 and the water block 10.

Figure 24:
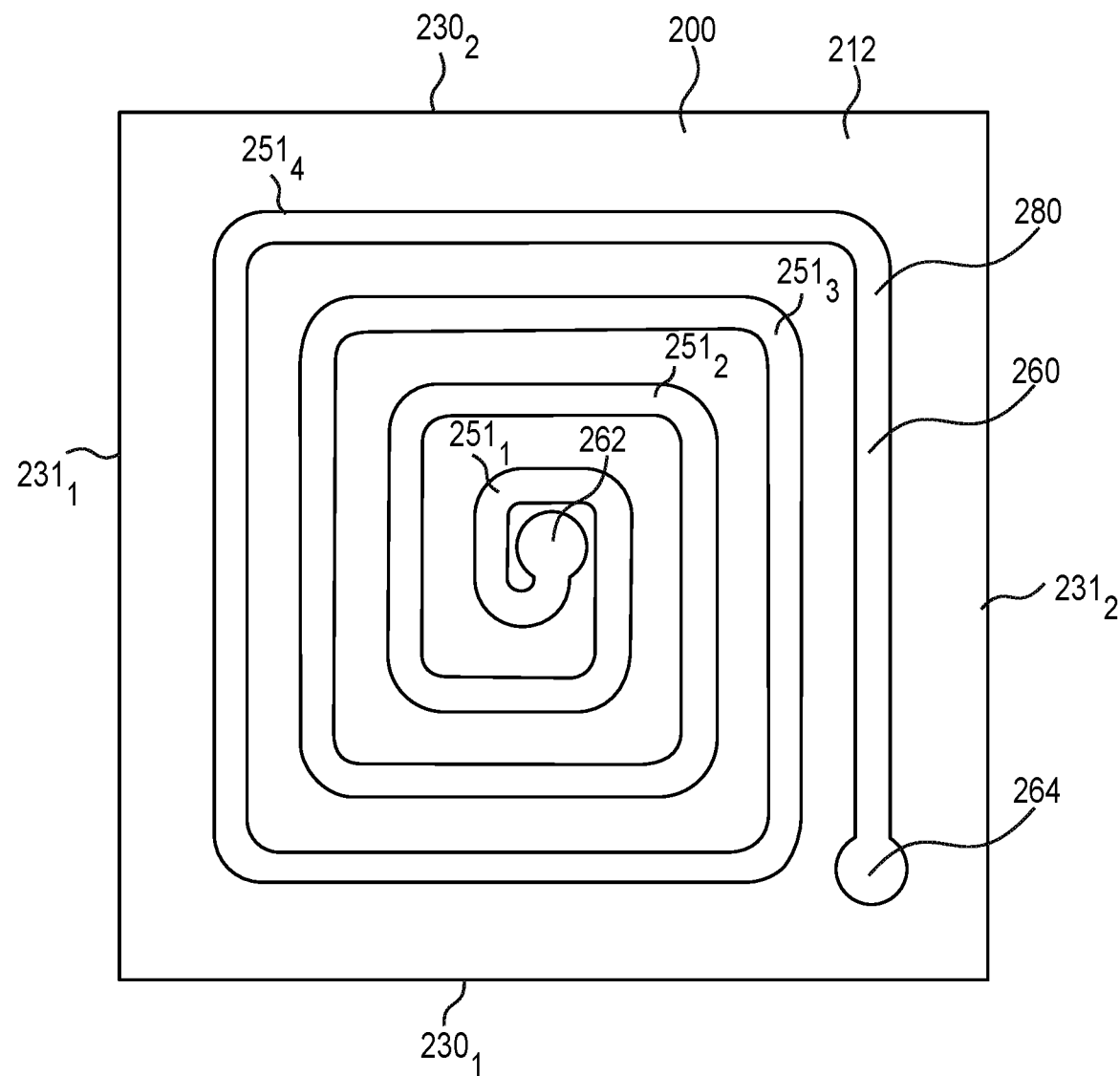
FIG. 24 is a top plan view of the base portion of the water block according to an alternative embodiment.

In another embodiment, as shown in FIG. 24, the lower fluid conduit portion 260 describes a generally spiral path along at least part of a span thereof between the first and second ends 262, 264 of the lower fluid conduit portion 260. Notably, in the embodiment of FIG. 24, the spiral path of the lower fluid conduit portion 260 is generally centered about the first end 262 (the inlet end 262) and has a plurality of ring sections $251_1$-$251_4$ which are concentric about the first end 262. The innermost ring sections $251_1$ is closest to the first end 262 (and thus the inlet 20) and the outermost ring section $251_4$ is furthest from the first end 262. In this embodiment, the second end 264 is located at the outermost ring section $251_4$. As can be seen, in this example, each ring section $251_i$ has a generally rectangular shape. In other examples, the ring sections may be circular in shape.

Figure 5:
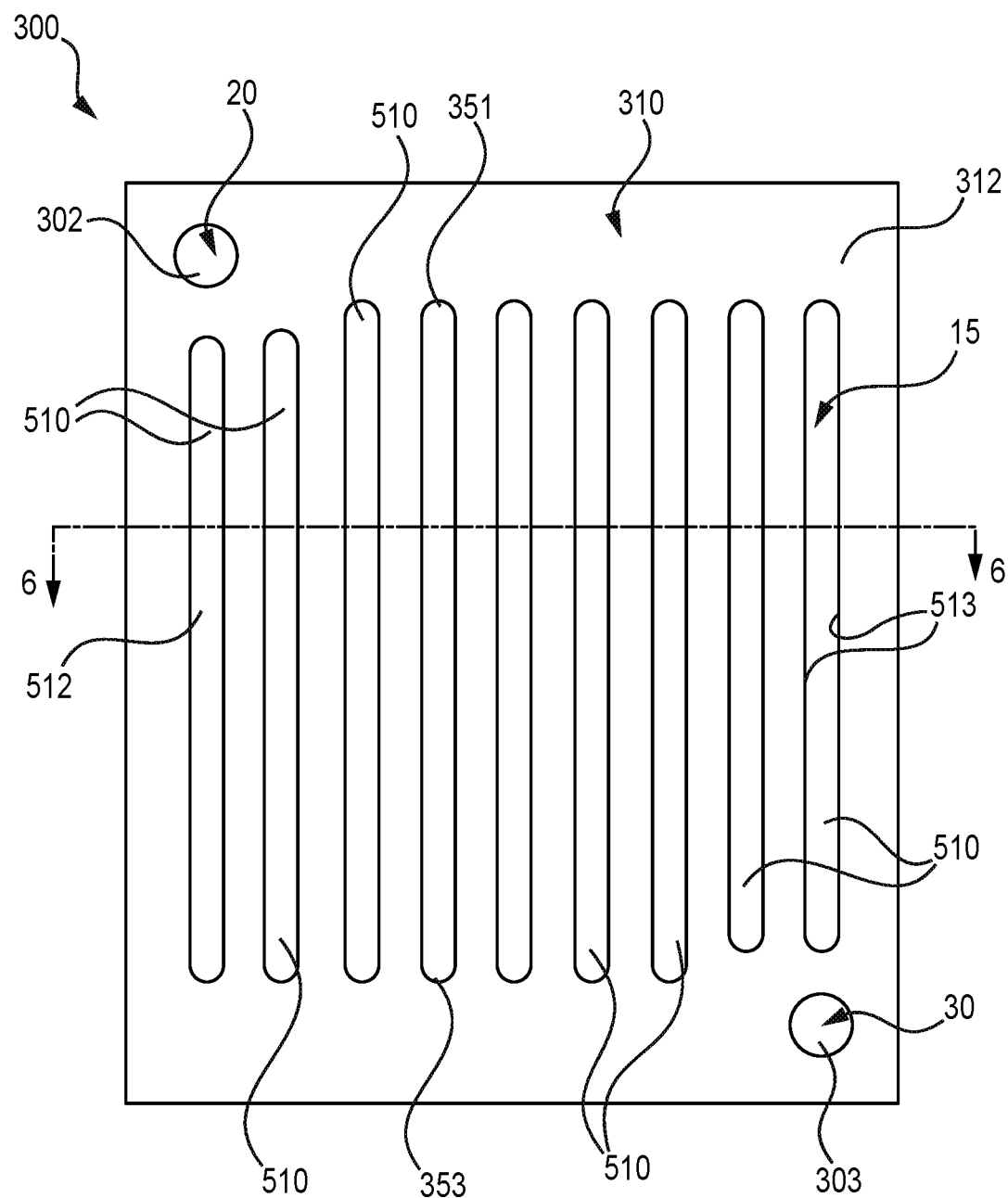
FIG. 5 is a bottom plan view of a cover portion of the water block of FIG. 1.

With reference to FIGS. 3 and 5, the cover portion 300 has a lower side 310 and an upper side 320 opposite the lower side 310. The upper external surface 120 is disposed on the upper side 320. The cover portion 300 defines openings 302, 303 which traverse the cover portion 300 form the lower side 310 to the upper side 320, such that, when the cover portion 300 is placed atop the base portion 200, the openings 302, 303 are generally aligned with the first and second ends 262, 264 of the lower fluid conduit portion 260. The openings 302, 303 thus define the fluid inlet 20 and the fluid outlet 30 of the water block 10 respectively.

The cover portion 300 comprises the hollow fins 500 on its upper side 320. Notably, as shown in FIGS. 1 and 2, the hollow fins 500 extend from the upper external surface 120 of the cover portion 300 in a height direction thereof. In this embodiment, the hollow fins 500 are generally parallel to one another and are spaced apart laterally. As best shown in FIG. 3, each of the hollow fins 500 extends longitudinally from a front longitudinal end 502 to a rear longitudinal end 504, a length of the hollow fin 500 being measured between the front and rear longitudinal ends 502, 504. As such, in this embodiment, the hollow fins 500 are rectilinear. The hollow fins 500 are hollow in that each hollow fin 500 defines a respective internal fin recess 510 which, as will be described below, forms part of the internal fluid conduit 15 of the water block 10.

In this embodiment, each hollow fin 500 is shaped such that, a cross-sectional profile thereof taken along a plane normal to the length of the fin 500 (measured between the front and rear longitudinal ends 502, 504) is generally rectangular. More specifically, the cross-sectional profile of the outer surfaces of the hollow fin 500 taken along said plane is generally rectangular. In particular, each hollow fin 500 has an upper end 506 defining an upper external surface 507, and opposite lateral external surfaces 508 (FIG. 2), all of which extend longitudinally between the front and rear longitudinal ends 502, 504. The lateral external surfaces 508 are generally parallel to one another, and the upper external surface 507 extends between the lateral external surfaces 508. The cross-sectional shape of the fins 500 may be different in other embodiments.

As best shown in FIGS. 2 and 3, the hollow fins 500 define a plurality of external fin passages 515 therebetween. In particular, each fin passage 515 is defined between two consecutive hollow fins 500, namely between opposite lateral external surfaces 508 thereof. In use, an external fluid (e.g., air or a dielectric fluid) flows within the fin passages 515 defined between the hollow fins 500. As can be appreciated, the hollow fins 500 promote thermal exchange with the external fluid as the external fluid flows within the external fin passages 515. In this embodiment, cover portion 300 is machined to form the external fin passages 515 between consecutive hollow fins 500, thereby forming the hollow fins 500 as well. For example, the hollow fins 500 and the fin passages 515 can be milled by a milling machine (e.g., a numerically controlled mill). Other manufacturing methods are also contemplated (e.g., molding).

Figure 6:
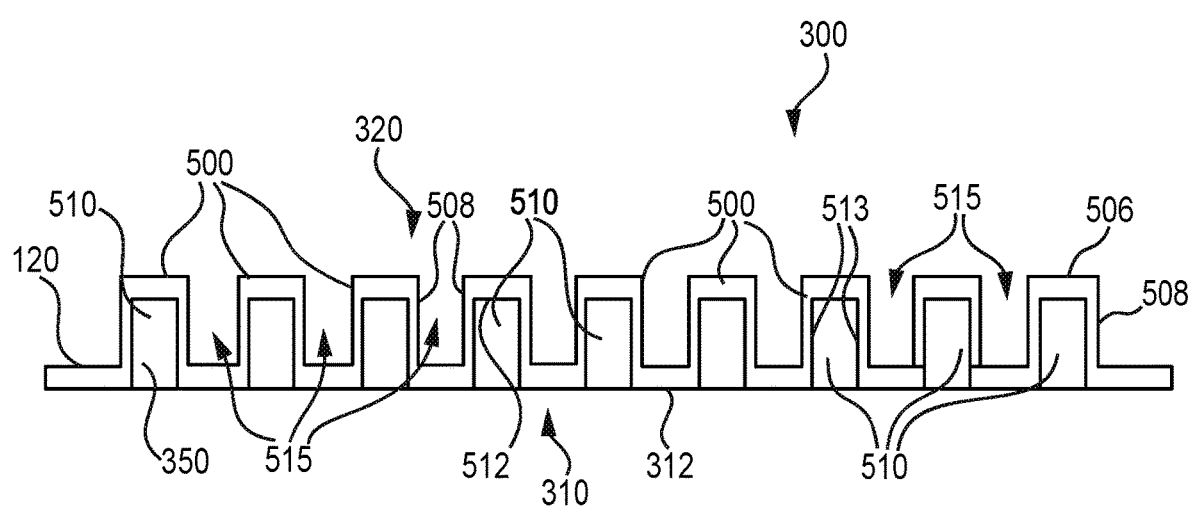
FIG. 6 is a cross-sectional view of the cover portion of the water block of FIG. 1, taken along line 6-6 in FIG. 5.
Figure 7A:
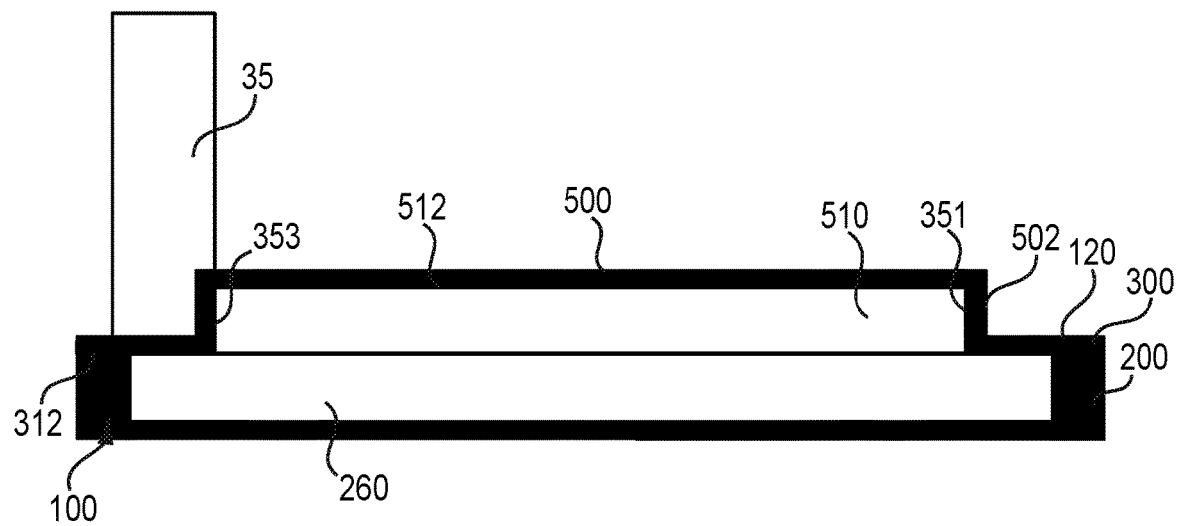
FIG. 7A is a cross-sectional view of the water block of FIG. 1 taken along line 7A-7A in FIG. 3.
Figure 8A:
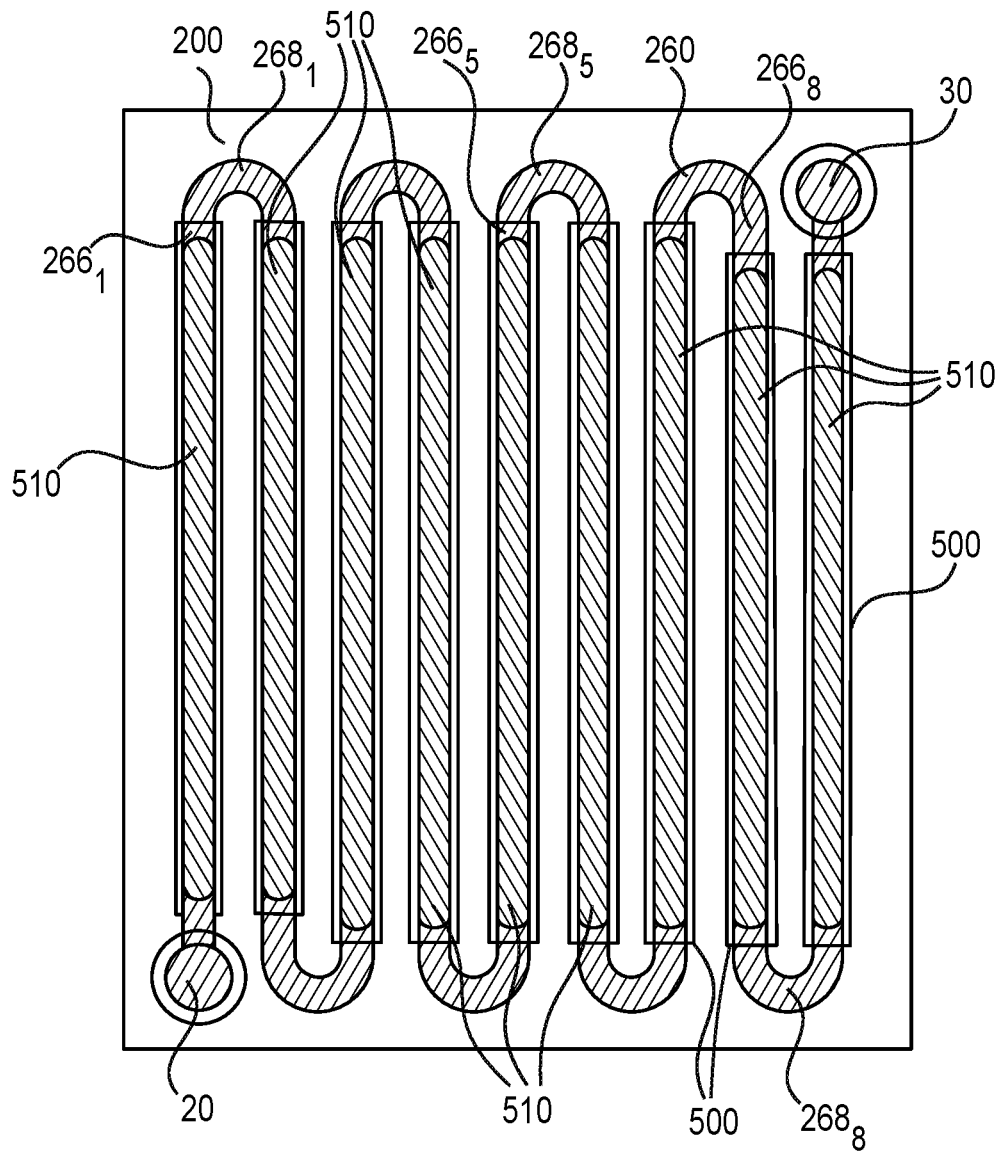
FIG. 8A is a top plan view of the water block of FIG. 1 illustrating the water block translucently to expose an internal fluid conduit of the water block, the internal fluid conduit being shaded in different hatch patterns to distinguish a lower fluid conduit portion and internal fin recesses formed by hollow fins of the water block.

With reference to FIGS. 5 and 6, on its lower side 310, the cover portion 300 comprises a lower surface 312 defining the internal fin recesses 510 of the hollow fins 500. In this embodiment, as shown in FIG. 5, each internal fin recess 510 extends longitudinally from a front recess end 351 to a rear recess end 353. Notably, as shown in FIG. 8A, in this embodiment, the length of each hollow fin 500 corresponds to at least a majority of the length of the body 100. Moreover, as best shown in FIG. 6, each internal fin recess 510 extends from the lower surface 312 to an internal upper fin surface 512, thereby establishing a height of the fin recess 510. In this embodiment, as best shown in FIG. 7A, the height of the internal fin recesses 510 is constant along the longitudinal direction (i.e., from the front recess end 351 to the rear recess end 353). Each internal fin recess 510 is bound on its lateral sides by two inner lateral fin surfaces 513 extending generally parallel to the lateral outer surfaces 508 of the corresponding hollow fin 500. As such, in this embodiment, as shown in FIG. 6, the internal fin recesses 510 have a generally rectangular cross-sectional profile.

In this embodiment, the internal fin recesses 510 are machined into the lower surface 312 of the cover portion 300. For example, the internal fin recesses 510 can be milled into the lower surface 312 by a milling machine (e.g., a numerically controlled mill). Other manufacturing methods are also contemplated (e.g., molding).

Figure 7B:
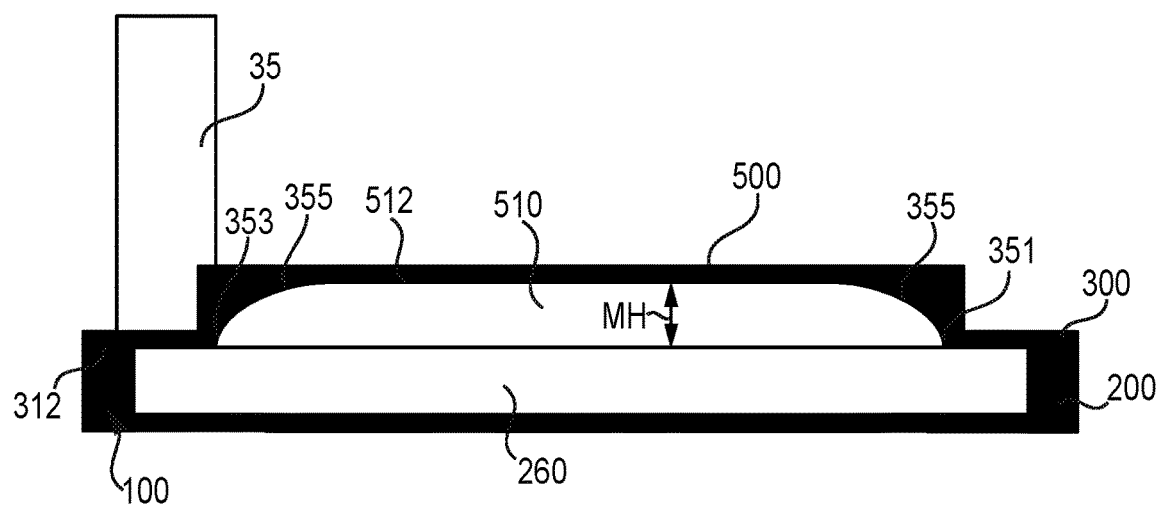
FIG. 7B is a cross-sectional view of the water block according to an alternative embodiment, taken along a same plane as FIG. 7A.

In an alternative embodiment, as shown in FIG. 7B, the height of the fin recesses 510 may be variable. Notably, in this alternative embodiment, each fin recess 510 has front and rear curved longitudinal end portions 355 (extending from the front and rear recess ends 351, 355) along which the height of the fin recess 510 increases to a constant middle height MH of a central recess portion disposed centrally between the front and rear curved longitudinal end portions 355. As can be seen, in this configuration, the internal upper fin surface 512 does not have square corners. This configuration may promote better flow of fluid within the internal fin recesses 510 and thereby improve thermal heat exchange at the hollow fins 500, namely as the gradual increase in height to the middle height MH may help prevent separated flow within the hollow fins 500 and fluid recirculation zones. Moreover, avoiding having square corner sections of the internal fin recess 510 within which fluid does not easily flow may also prevent air pockets forming therein.

Returning now to FIGS. 4 and 5, in this embodiment, the number of hollow fins 500 (and thereby internal fin recesses 510) corresponds to the number of longitudinally-extending sections $266_1$-$266_9$. Notably, each internal fin recess 510 is aligned with a respective one of the longitudinally-extending sections $266_1$ of the lower fluid conduit portion 260 of the base portion 200. That is, as shown in FIG. 8A which illustrates the internal fin recesses 510 in a different hatch pattern from the lower fluid conduit portion 260 for clarity, each of the internal fin recesses 510 overlaps a majority of the corresponding longitudinally-extending section $266_1$-$266_9$ such that the internal fin recesses 510 are a continuation, in the height direction of the water block 10, of the longitudinally-extending sections $266_1$-$266_9$. As such, the internal fin recesses 510 collaborate with the lower fluid conduit portion 260 to form the internal fluid conduit 15 of the water block 10.

In this embodiment, the lower surface 312 of the cover portion 300, which is a planar surface, covers the looping sections $268_1$-$268_8$ of the lower fluid conduit portion 260. Other configurations are contemplated in alternative embodiments. For instance, the lower surface 312 could cover other portions of the lower fluid conduit portion 260 such as portions of longitudinally-extending sections $266_1$.

In some embodiments, the lower surface 312 may also define a continuous recess generally corresponding in shape and dimensions to the continuous recess 280 of the base portion 200 (i.e., having the same path—in this example, the serpentine path) so as to form the lower fluid conduit portion 260 together with the continuous recess 280. In such embodiments, the fin recesses 510 open into the continuous recess of the cover portion 300.

Figure 8B:
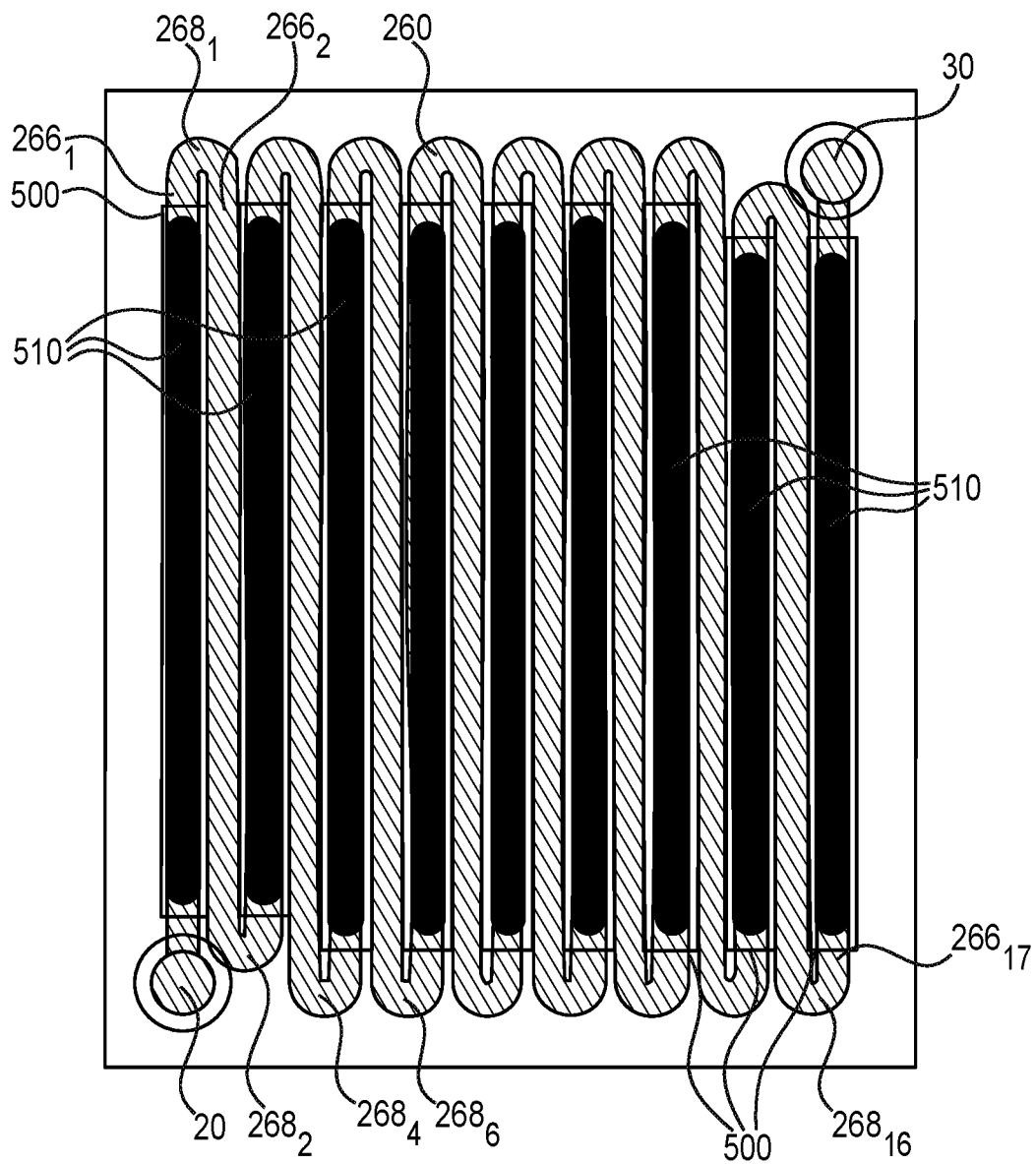
FIG. 8B is a top plan view of the water block according to an alternative embodiment, illustrating the water block translucently to expose the internal fluid conduit of the water block.

In some embodiments, the number of longitudinally-extending sections may be different from the number of hollow fins 500. For instance, as shown in FIG. 8B, in some embodiments, the number of longitudinally-extending sections $266_1$-$266_{17}$ is greater than the number of hollow fins 500 and thus some of the longitudinally-extending sections $266_1$-$266_{17}$ may not be aligned with any of the internal fin recesses 510. More specifically, in this alternative embodiment, one out of two consecutive longitudinally-extending sections $266_1$-$266_{17}$ is aligned with one of the internal fin recesses 510. It is contemplated that, in alternative embodiments, different alternating patterns of the longitudinally-extending sections could be aligned with corresponding ones of the hollow fins 500. For instance, two out of three consecutive longitudinally-extending sections could be aligned with two respective internal fin recesses 510.

Figure 14:
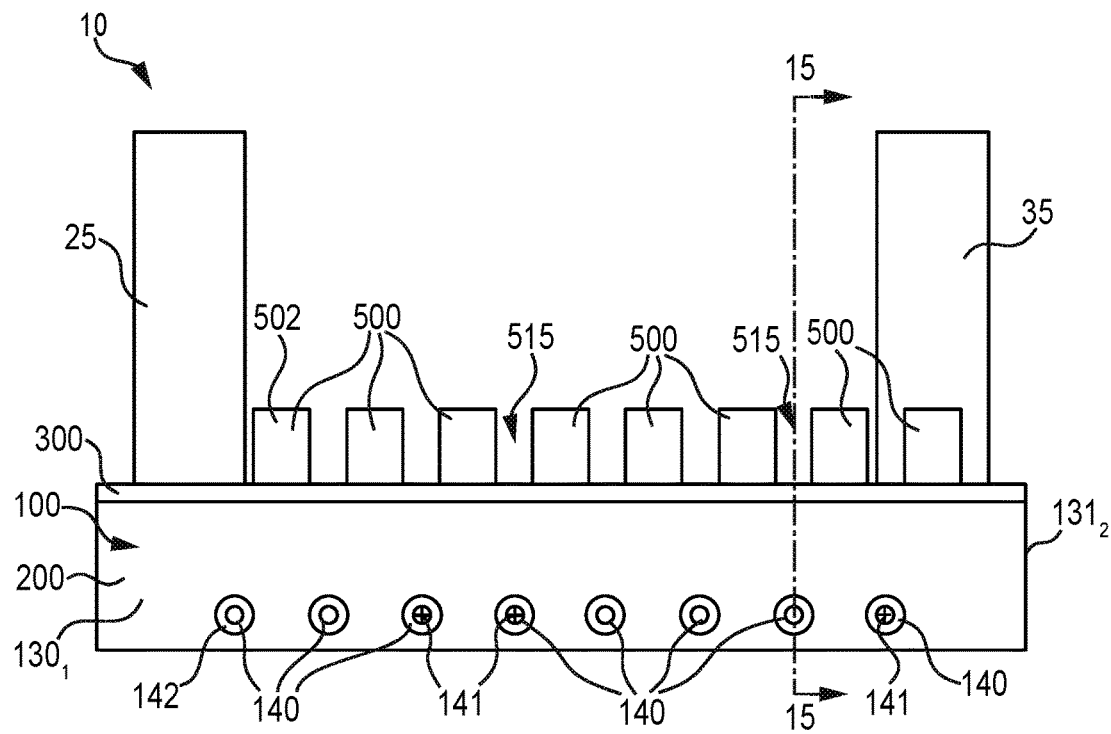
FIG. 14 is a front elevation view of the water block according to an alternative embodiment in which the water block defines a plurality of external conduits.
Figure 15:
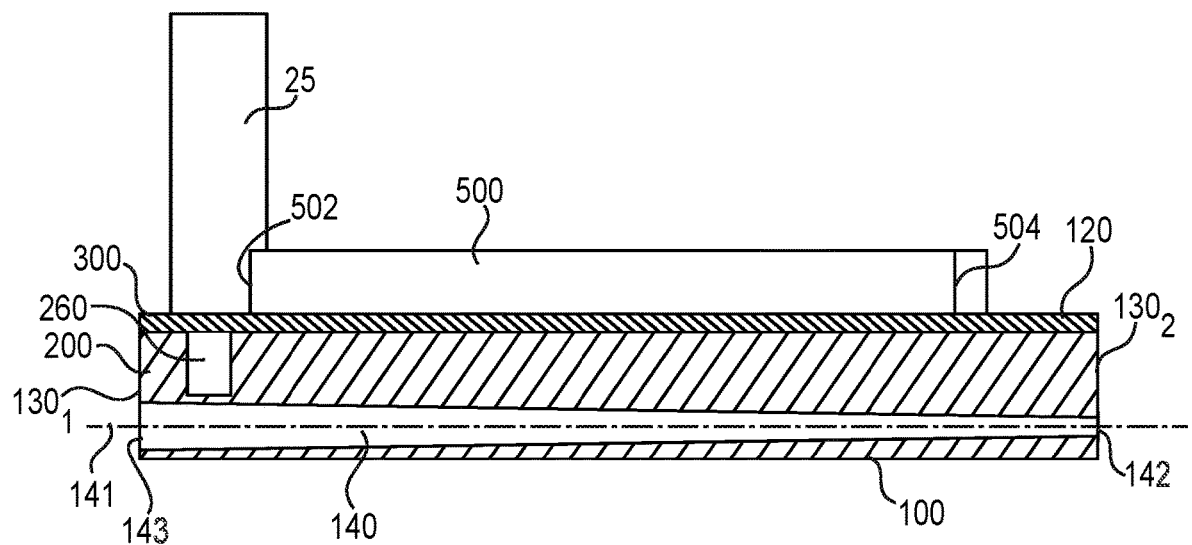
FIG. 15 is a cross-sectional view of the water block of FIG. 14 taken along line 15-15 in FIG. 14.

With reference to FIGS. 14 and 15, in some embodiments, the body 100 of the water block 10 defines a plurality of external conduits 140 to allow fluid flow therein. Notably, in use, similarly to the fin passages 515, an external fluid (e.g., air or a dielectric fluid) flows within the external conduits 140. This may further promote thermal exchange between the water block 10 and the external fluid to provide greater cooling efficiency to the water block 10. In particular, the external conduits 140 increase the surface area through which heat exchange takes places between the water block 10 and the external fluid and permit a reduction in the temperature of the thermal transfer surface 110. In this alternative embodiment, each external conduit 140 is defined by the base portion 200 of the water block 10 and extends between the front and rear longitudinal ends $130_1$, $130_2$. It is contemplated that, in other embodiments, the external conduits 140 could extend between the opposite lateral ends $131_1$, $131_2$. As shown in FIG. 15, in this alternative embodiment, each external conduit 140 is centered about a central conduit axis 141, and the central conduit axes 141 of the external conduits 140 extend parallel to one another. Notably, the central conduit axes 141 extend parallel to the fin passages 515 such that, in use, fluid flow through the fin passages 515 is in the same direction as fluid flow through the external conduits 140. In this particular example, the external conduits 140 are generally conical, notably increasing in size from a first end 142 to a second end 143. In particular, a diameter of each external conduit 140 is smaller at the first end 142 than at the second end 143. In use, the external fluid flows through each external conduit 140 from the first end 142 to the second end 143 (i.e., from the smaller end to the larger end). This can be useful when the external fluid expands as it becomes heated while flowing through the external conduits 140. It is contemplated that, in other embodiments, the external conduits 140 could be straight circular holes having the same diameter at the two ends 142, 143.

The hollow fins 500 may also be shaped differently in other embodiments.

Figure 16:
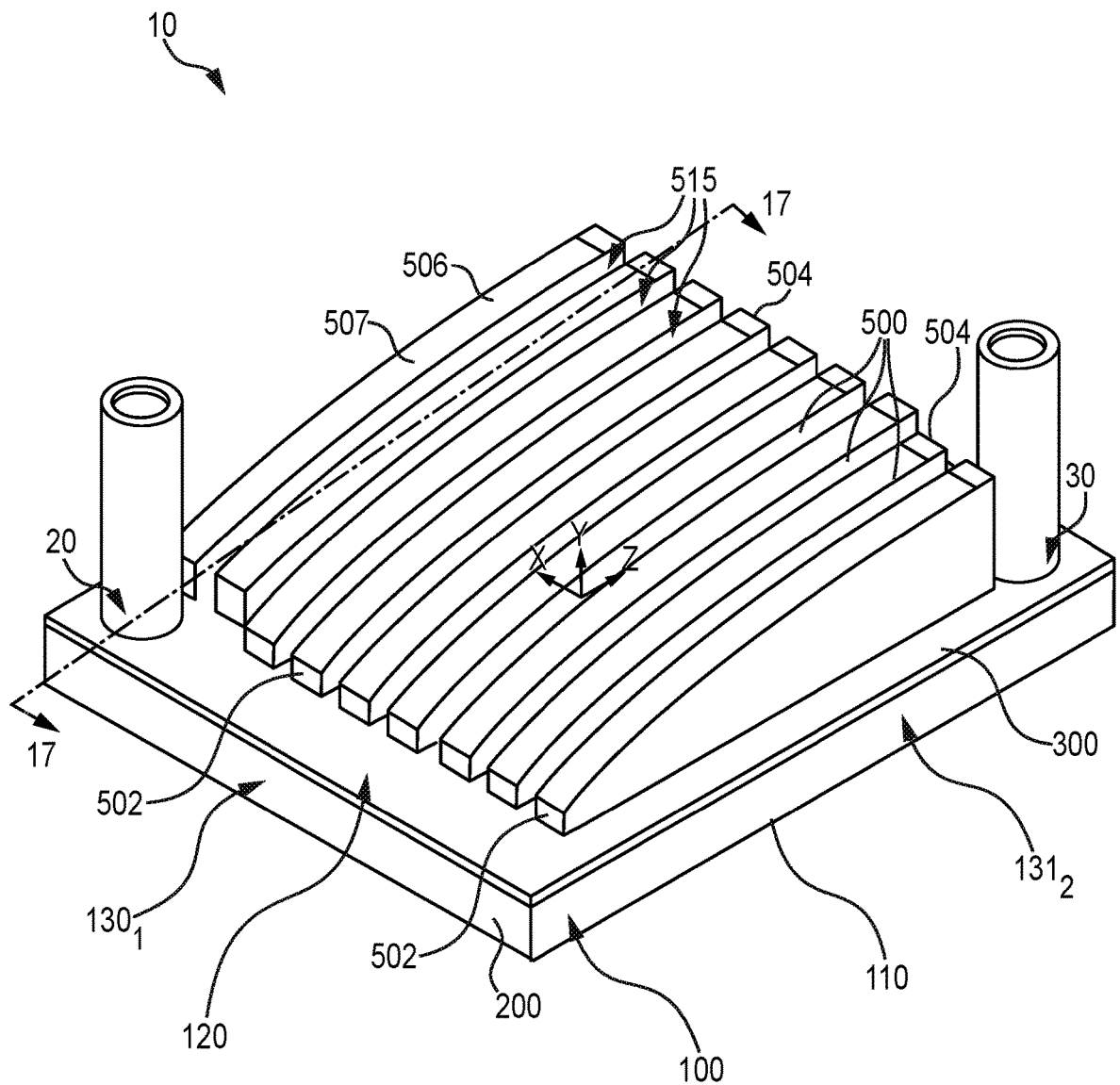
FIG. 16 is a perspective view, taken from a top, front, right side, of the water block according to another alternative embodiment in which the hollow fins have a variable height.
Figure 17:
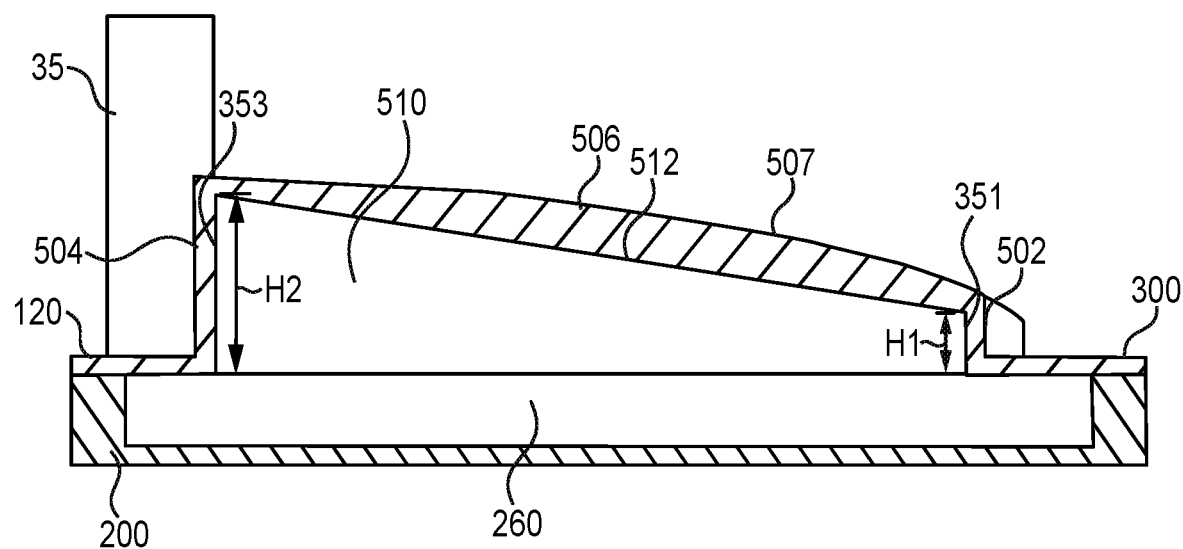
FIG. 17 is a cross-sectional view of the water block of FIG. 16 taken along line 17-17 in FIG. 16.

For instance, with reference to FIGS. 16 and 17, in an alternative embodiment, the height of each hollow fin 500, measured from the upper surface 120 of the cover portion 300 to the upper external surface 507 of the hollow fin 500, increases from the front end 502 to the rear end 504 of the hollow fin 500. In this example, the upper external surface 507 of each hollow fin 500 is curved. As shown in FIG. 17, the internal fin recess 510 of each hollow fin 500 increases in height, notably from the front recess end 351 to the rear recess end 353 in this example. In particular, for any one of the fins 500, at the front recess end 351, a height H1 is measured from the lower surface 312 of the cover portion 300 to the upper fin surface 512, while at the rear recess end 353 a height H2 greater than the height H1 is measured from the lower surface 312 of the cover portion 300 to the upper fin surface 512. A ratio H2/H1 of the height H2 over the height H1 may be between 2 and 3 inclusively. For instance, in this embodiment, the ratio H2/H1 is approximately 2.8. In this example, the lower fluid conduit portion 260 has the shape described with reference to FIG. 12 such that in each hollow fin 500, fluid flows in parallel from the smaller front recess end 351 to the bigger rear recess end 353. This increase in height of the hollow fins 500 may be helpful to increase the surface area through which heat exchange takes places between the water block 10 and the external fluid, notably as the external fluid flowing within the external fin passages 515 may expand as it heats up while flowing through the external fin passages 515.

Figure 19:
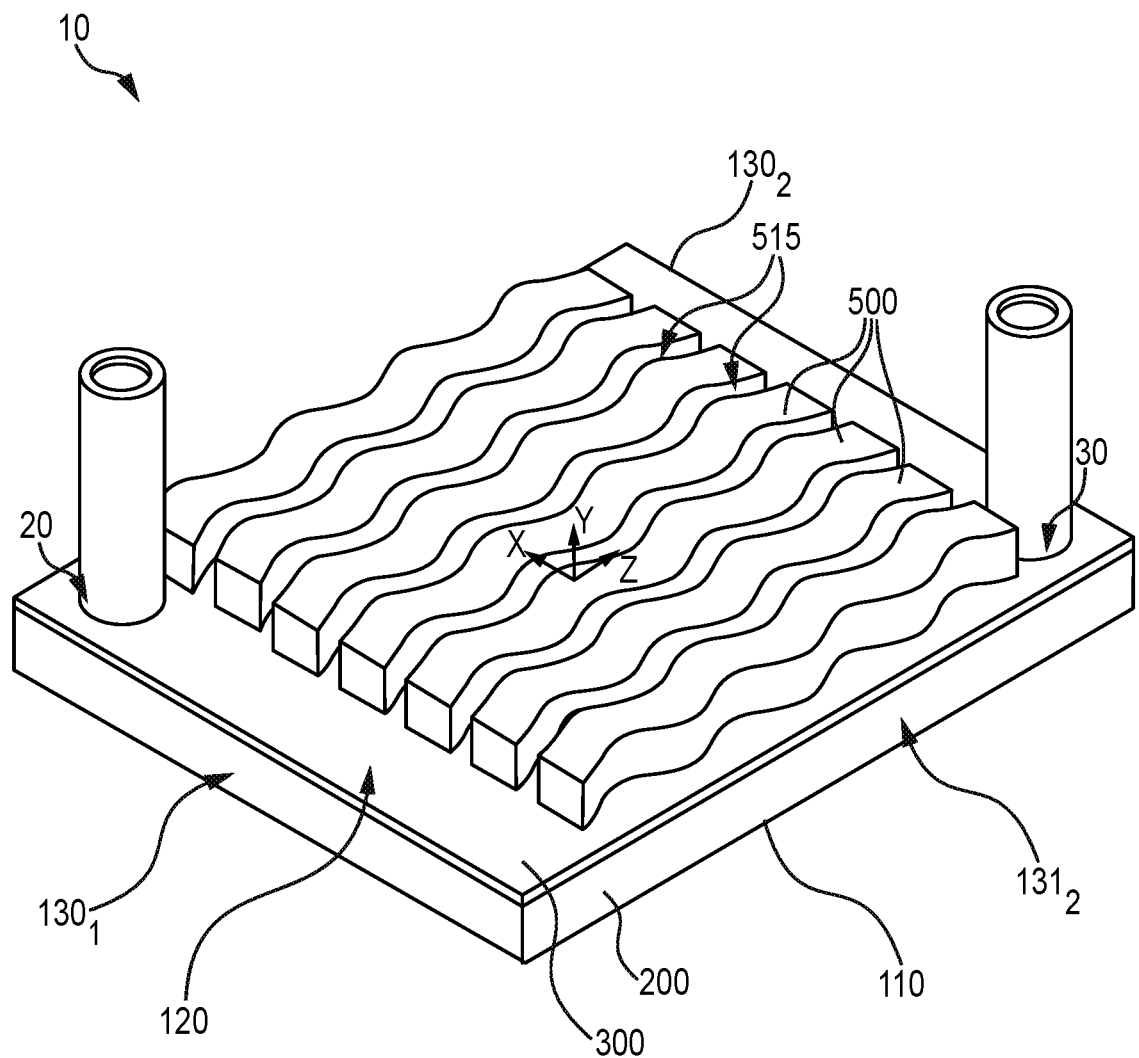
FIG. 19 is a perspective view, taken from a top, front, right side, of the water block according to another alternative embodiment in which the base portion of the water block is the base portion of FIG. 18.
Figure 20:
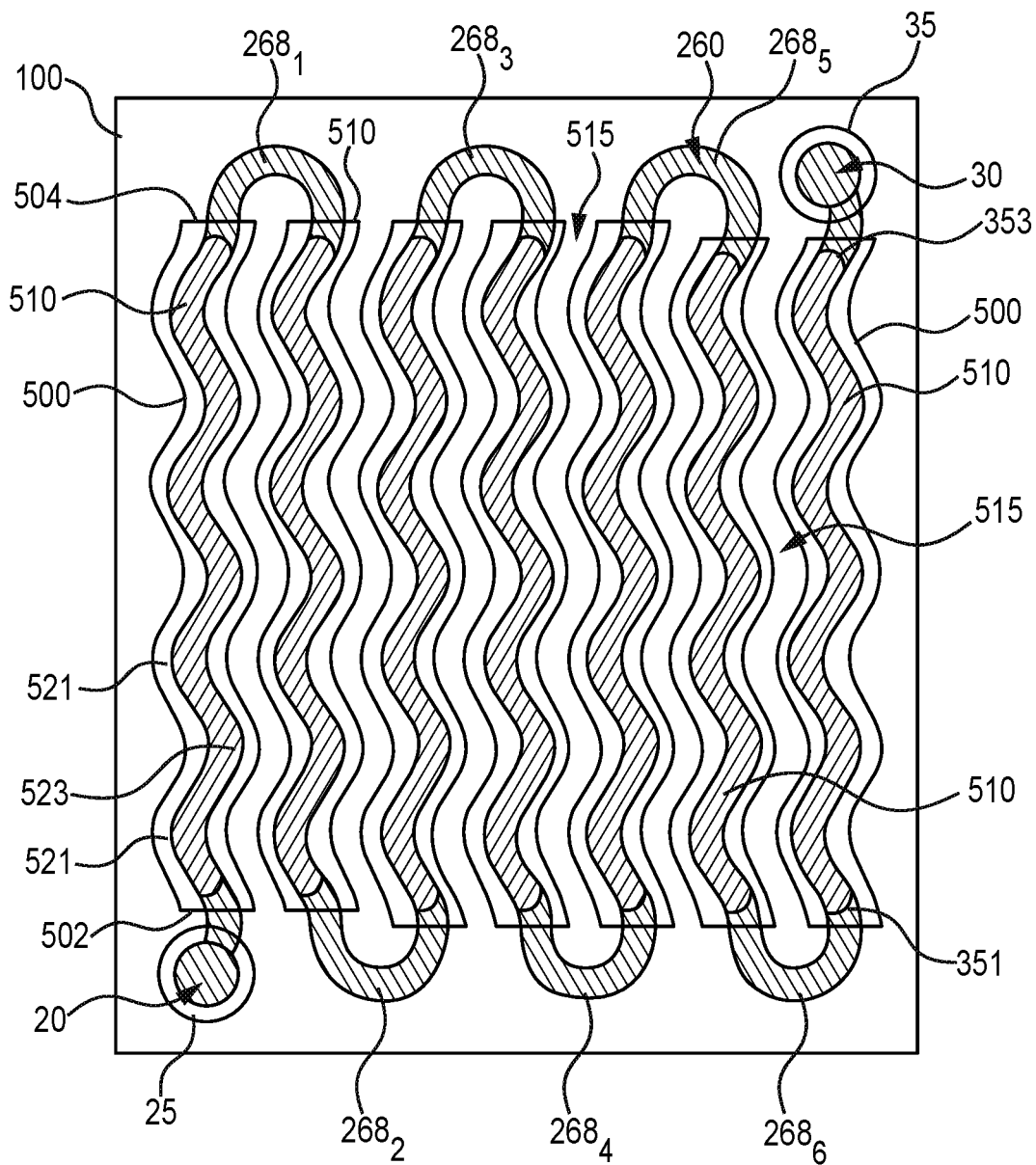
FIG. 20 is a top plan view of the water block of FIG. 19, illustrating the water block translucently to expose the internal fluid conduit.

In another alternative embodiment, with reference to FIGS. 19 and 20, the hollow fins 500 define a sinusoidal pattern along at least a majority of a length thereof, notably having alternatingly-oriented undulations approximating a shape of a sinusoidal function. As such, the external fin passages 515 also have a sinusoidal shape. Such a shape of the hollow fins 500 may be implemented for example when the lower fluid conduit portion 260 describes the path shown in FIG. 18. In particular, in this alternative embodiment, as shown in FIG. 20, the internal fin recesses 510 define the same sinusoidal pattern as the longitudinally-extending sections $266_1$-$266_7$, such that each internal fin recess 510 describes the same path as the longitudinally-extending sections $266_1$ that the internal fin recess 510 overlaps. As explained above with regard to the longitudinally-extending sections $266_1$-$266_7$ of FIG. 18, the sinusoidal pattern of the hollow fins 500 increases the surface area thereof available for heat exchange with the external fluid (e.g., air or a dielectric fluid) flowing through the external fin passages 515, which can therefore improve the performance of the water block 10.

Figure 9:
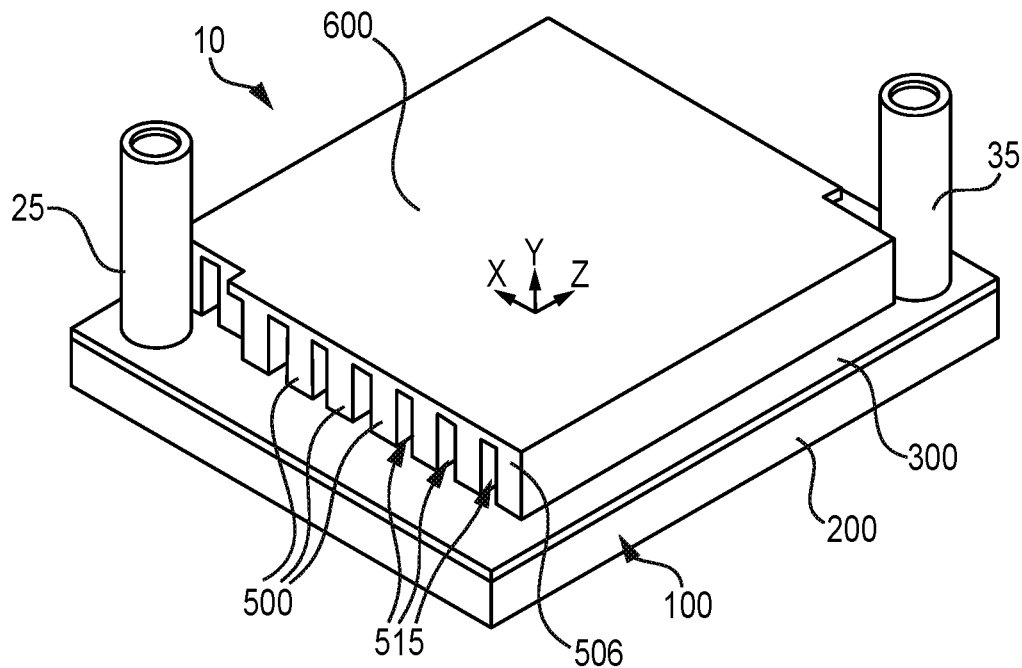
FIG. 9 is a perspective view, taken from a top, front, right side, of the water block according to another alternative embodiment, in which the water block includes a fin cover.
Figure 10:
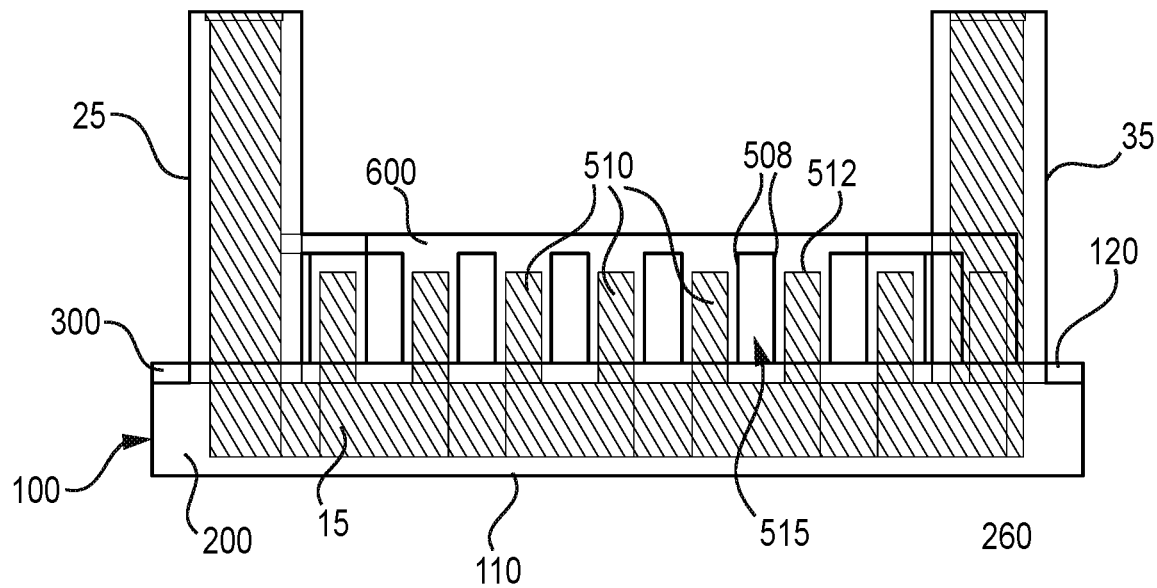
FIG. 10 is a front elevation view of the water block of FIG. 9, illustrating the water block translucently to expose the internal fluid conduit.

With reference to FIGS. 9 and 10, in some embodiments, the water block 10 has a fin cover 600 interconnecting the upper ends 506 of the hollow fins 500 and extending generally parallel to the opposite external surface 120 of the body 100. The fin cover 600 can be referred to as a "plate member" in that it is generally a thin planar component. As can be seen, the fin cover 600 overlies the hollow fins 500 such that the external fin passages 515 are closed from a top thereof. More specifically, each external fin passage 515 is defined between two opposite lateral external surfaces 508 of two consecutive hollow fins 500, the opposite external surface 120 of the cover portion 300 and a lower surface of the fin cover 600. Providing a top enclosure to the fin passages 515 can cause the fluid flow therethrough to reach a greater velocity, notably as an additional fluid boundary layer is formed at the lower surface of the fin cover 600 as fluid flows through the external fin passages 515. The boundary layers formed at each of the four surfaces defining an external fin passage 515 have a velocity gradient whereby the velocity of fluid is greatest further from a corresponding surface. Therefore, the boundary layers generally intersect one another at a central point where velocity of the fluid flowing through the external fin passage 515 is maximal as the velocity gradients of each of the boundary layers is combined at that central point. Therefore, the velocity gradient of the boundary layer formed at the lower surface of the fin cover 600 causes the velocity of fluid flow through the external fin passages 515 to increase. The fin cover 600 may be connected to the hollow fins 500 in any suitable way. For instance, in this example of implementation, the fin cover 600 is welded to the upper ends 506 of the hollow fins 500. It is contemplated that, in other embodiments, the fin cover 600 may be formed integrally with the hollow fins 500.

Figure 11A:
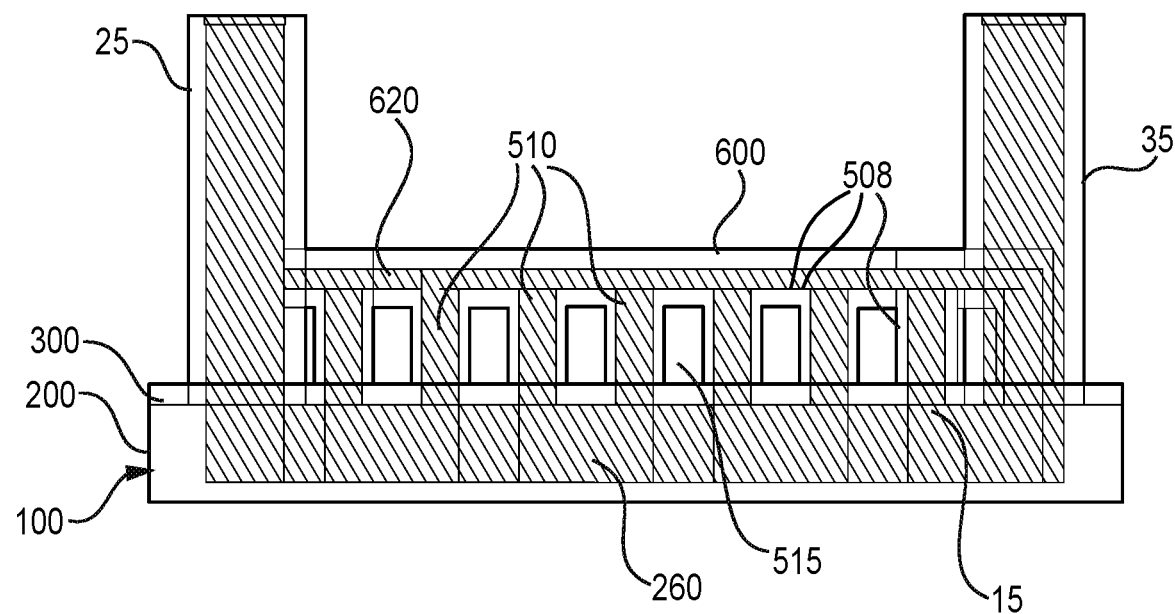
FIG. 11A is a front elevation view of the water block according to another alternative embodiment, illustrating the water block translucently to expose the internal fluid conduit.
Figure 11B:
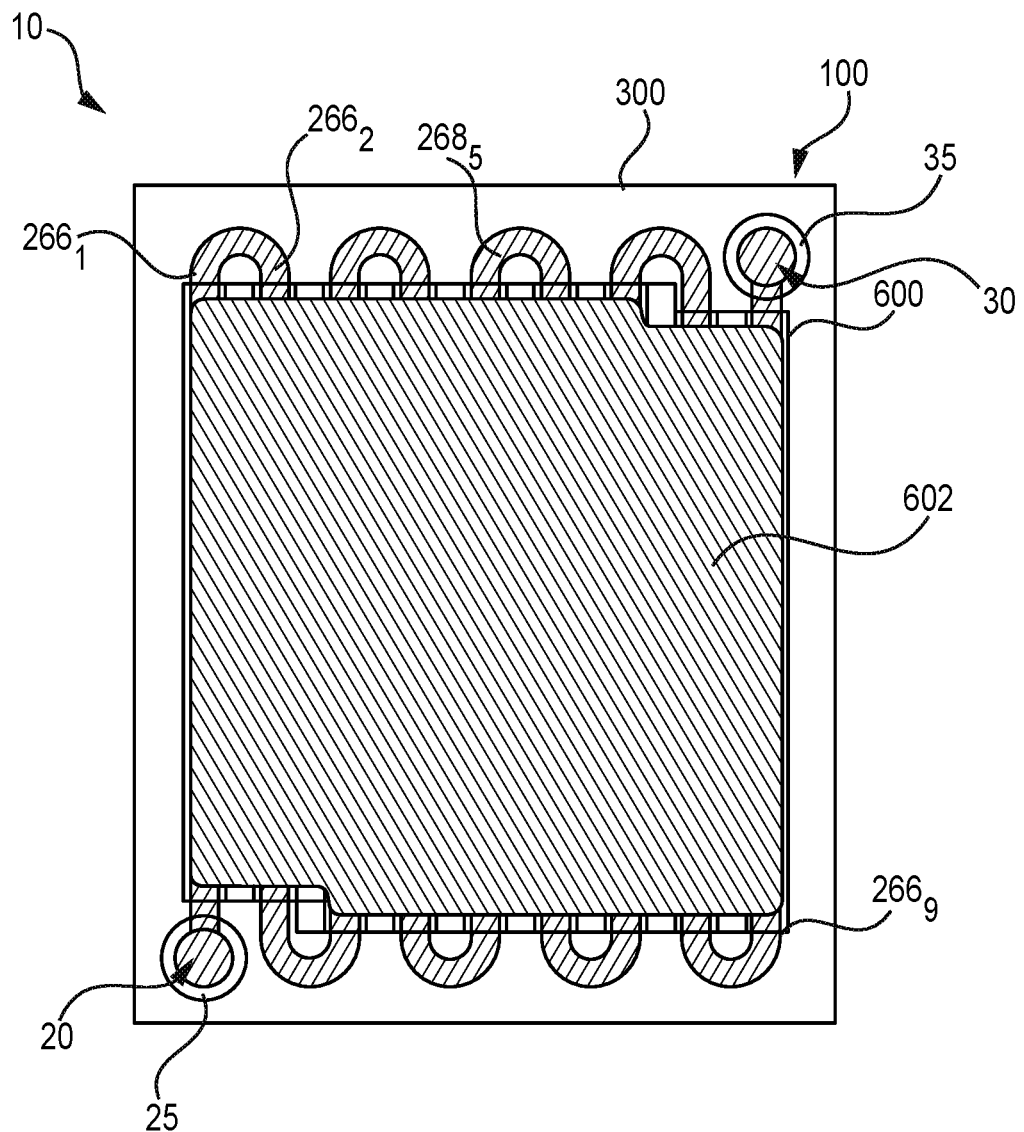
FIG. 11B is a top plan view of the water block of FIG. 11A, illustrating the water block translucently to expose the internal fluid conduit.

Moreover, with reference to FIGS. 11A and 11B, in some embodiments, the fin cover 600 may define an internal cover conduit 602 fluidly connecting the internal fin recesses 510 of the plurality of hollow fins 500. In such embodiments, the internal fin recesses 510 are not bound by the internal upper fin surface 212, and the internal fin recesses 510 open into the internal cover conduit 602. As shown in FIG. 11B, in this embodiment, the internal cover conduit 602 spans a majority of a length and a width of the fin cover 600. Notably, the internal cover conduit 602 extends, laterally, from the leftmost longitudinally-extending section $266_1$ to the rightmost longitudinally-extending section $266_9$. Moreover, the internal cover conduit 602 extends along a majority of the length of each longitudinally-extending section $266_1$. In this embodiment, the internal cover conduit 602 does not overlap the looping sections $268_1$-$268_8$. The internal cover conduit 602 may be configured differently in other embodiments. The internal cover conduit 602 thus provides a greater amount of heat to be exchanged at the fin cover 600 which advantageously has a relatively large surface area. Furthermore, it can prevent presence of trapped air at the upper ends of the internal fin recesses 510.

As can be appreciated, the hollow fins 500 can provide the water block 10 with increased cooling efficiency and/or redundancy. Notably, in operation, in addition to the cooling provided by the water flowing within the internal fluid conduit 15 of the water block 10, a fluid (e.g., air flowing within an enclosure of the heat-generating component 50) can pass within the external fin passages 515 to collect heat from the water block 10 via the external surfaces of the hollow fins 500, thereby improving the cooling provided by the water block 10. In addition to providing improved cooling by this thermal exchange via the hollow fins 500, the hollow fins 500 can also ensure a certain amount of redundancy of the water block 10. For instance, the internal fluid conduit 15 of water block 10 (or an external fluid circuit feeding the water block 10) is interrupted (e.g., due to clogging of the internal fluid conduit 15), the hollow fins 500 can still promote some degree of heat dissipation from the water block 10 which, while not ideal, may allow sufficient time for a maintenance operation to be carried out and re-establish water flow through the water block 10 while avoiding further degradation or even failure of the heat-generating component 50.

Figure 13:
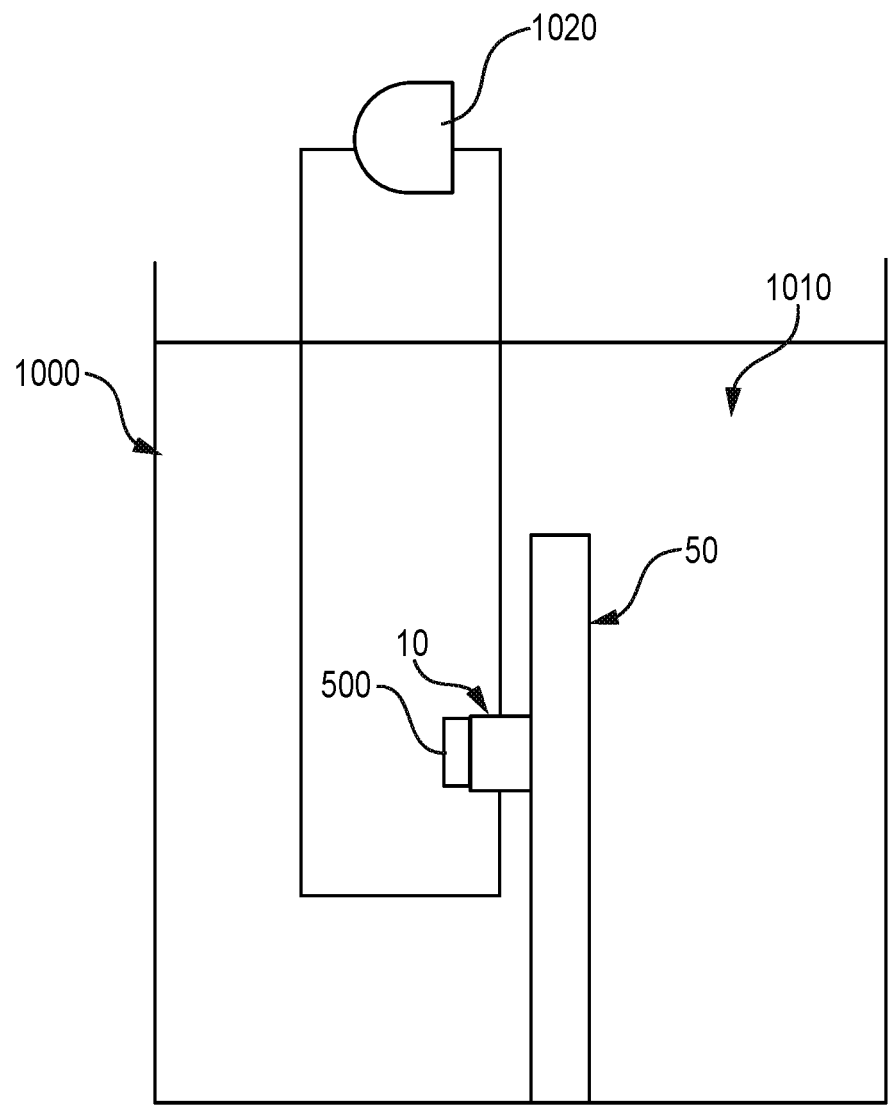
FIG. 13 is a schematic representation of a heat transfer system including an immersion cooling tank and the water block.

Furthermore, as will be appreciated, the water block 10 can be useful in various applications, including for example in an immersion cooling heat transfer system. That is, the water block 10 can be used as part of a heat transfer system implementing immersion cooling whereby the heat-generating component 50 is immersed in a heat transfer fluid. A method for installing such a heat transfer system for cooling the heat-generating component 50 will now be described in detail with reference to FIG. 13. As can be seen, the heat-generating component 50 is placed in an immersion cooling tank 1000. The immersion cooling tank 1000 may be any container (e.g., a casing) suitable for use in immersion cooling of the heat-generating component 50. It is to be understood that the heat-generating component 50 may be connected to a substrate component (e.g., a printed circuit board (PCB)) in which case the substrate component is placed in the immersion cooling tank 1000 together with the heat-generating component 50. As can be seen, in this embodiment, the water block 10 is oriented such that hollow fins 500 thereof extend generally vertically (i.e., the fin passages 515 extend vertically). This may be helpful to promote natural convection of fluid through the hollow fins 500. The water block 10 may be oriented differently in other embodiments. The water block 10 is installed on the heat-generating component 50 such that the external thermal transfer surface 110 thereof is thermally connected to the heat-generating component 50. Next, a first heat transfer fluid, namely water in this example, is pumped through the internal fluid conduit 15 including the internal fin recesses 510 of the hollow fins 500. For instance, the water block 10 may be fluidly connected to an external cooling circuit 1020 that delivers cooled water to the water block 10 and receives heated water from the water block 10. For example, the external cooling circuit 1020 may include a dry cooler for cooling the heated water and a pumping module for pumping the water through the external cooling circuit 1020. The immersion cooling tank 1000 is then filled with a second heat transfer fluid 1010 different from the first heat transfer fluid, namely a dielectric fluid 1010. The heat-generating component 50 and the water block 10 are thus immersed in the dielectric fluid 1010. The dielectric fluid 1010 thus flows between the hollow fins 500, within the external fin passages 515, thereby transferring thermal energy water from the water flowing within the internal fin recesses 510 of the hollow fins 500 to the dielectric fluid 1010 contained in the immersion cooling tank 1000. In some embodiments, a pumping system (not shown) is connected to the immersion cooling tank to pump the dielectric fluid 1010 through the immersion cooling tank 1000, and the dielectric fluid 1010 thus flows between the hollow fins 500 due to forced convection. In alternative embodiments, the pumping system may be omitted and the dielectric fluid 1010 simply flows between the hollow fins 500 due to natural convection generated by the different gradient of temperatures.

The water block 10 may be configured differently in other embodiments. For instance, as will be described below, a single hollow fin may be provided having sections extending in different directions.

Figure 21:
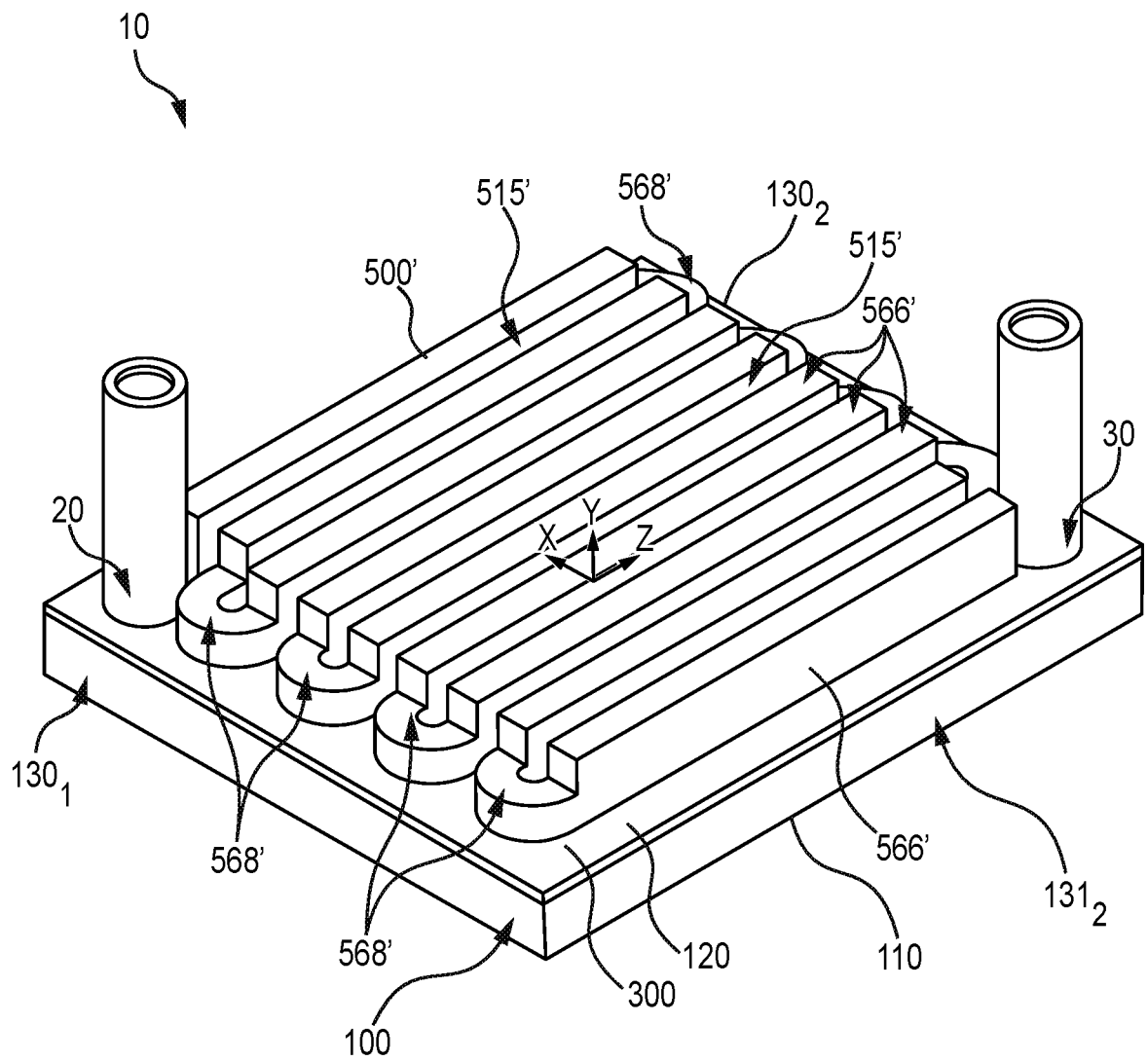
FIG. 21 is a perspective view, taken from a top, front, right side, of the water block according to another alternative embodiment.
Figure 22:
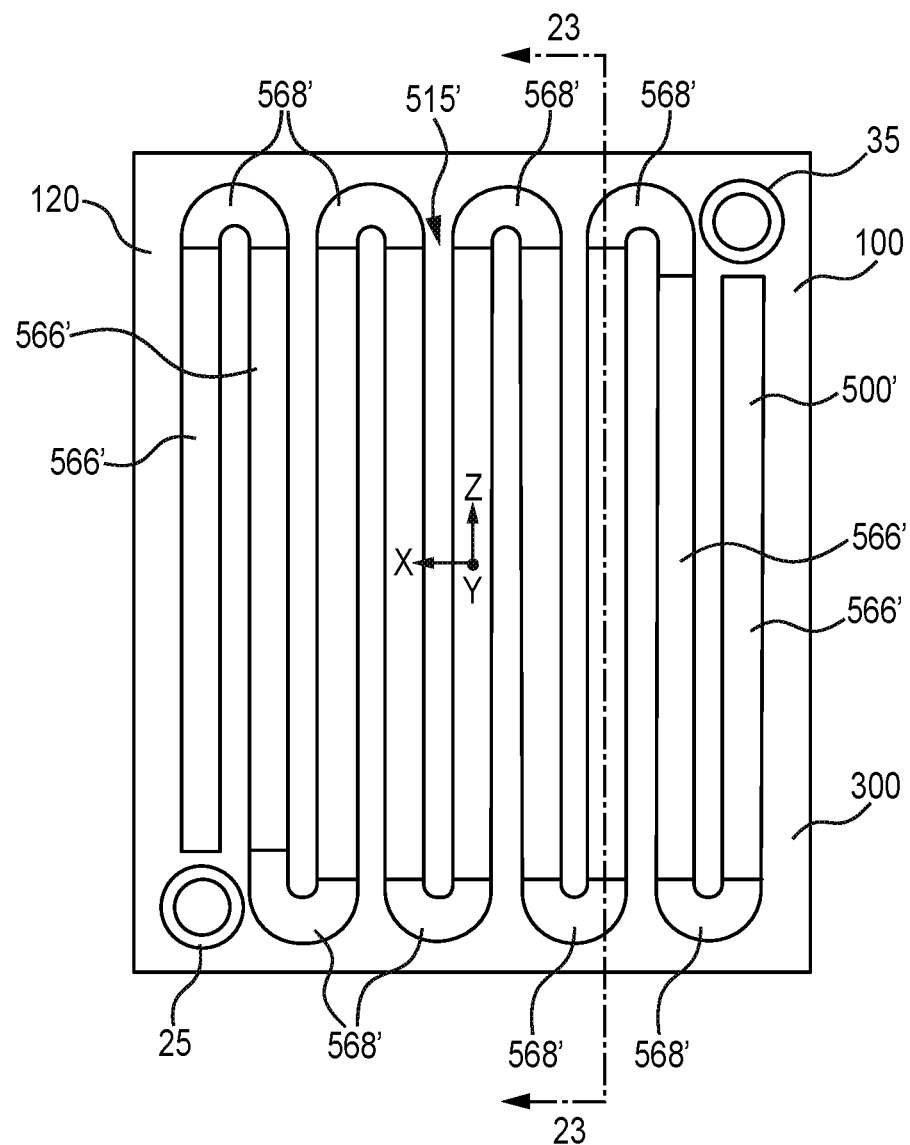
FIG. 22 is a top plan view of the water block of FIG. 21.
Figure 23:
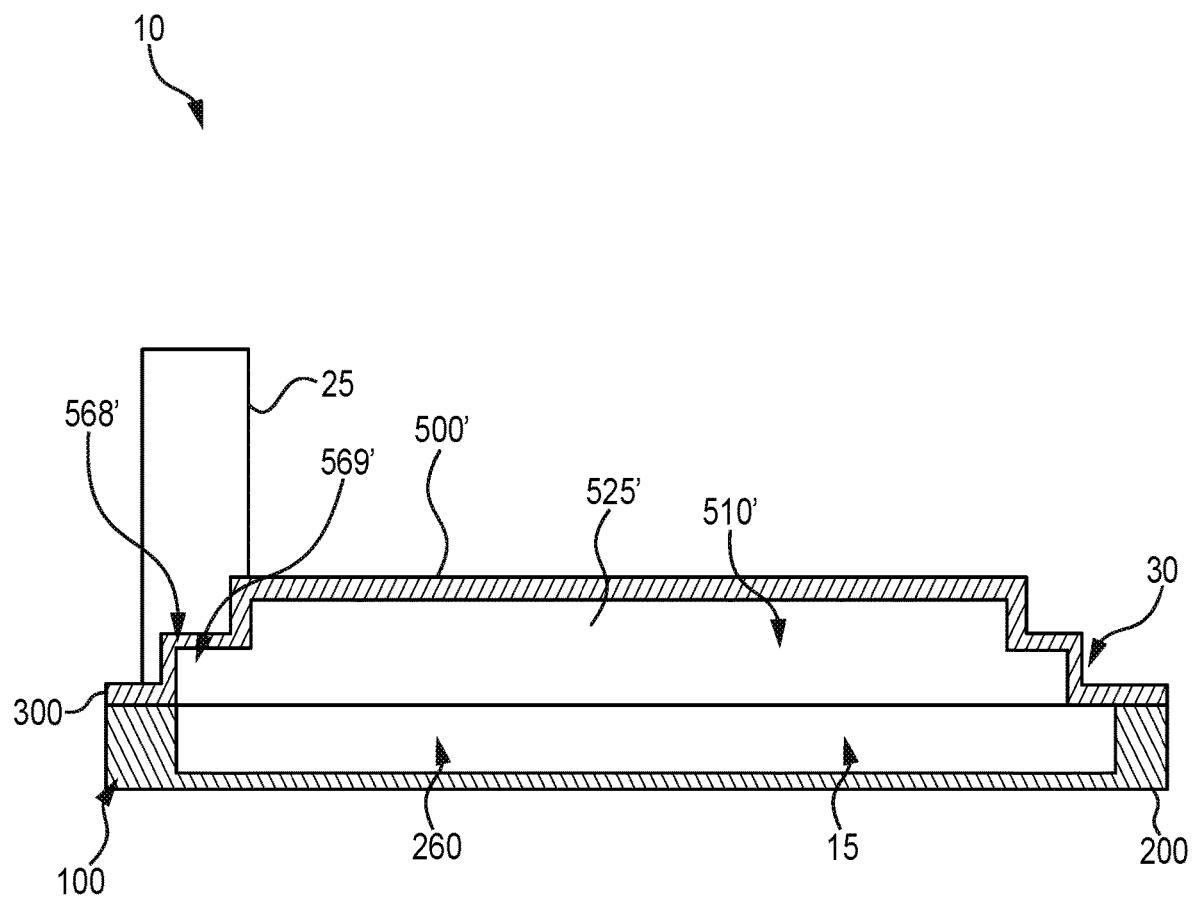
FIG. 23 is a right side elevation view of the water block of FIG. 21, illustrating the water block translucently to expose the internal fluid conduit.

For instance, with reference to FIGS. 21 to 23, in an alternative embodiment, a single hollow fin 500' is provided instead of multiple hollow fins. The hollow fin 500' is shaped so that an internal fin recess 510' formed thereby (FIG. 21) describes a same path as the underlying lower fluid conduit portion 260. In this example, the lower fluid conduit portion 260 describes the serpentine path shown and described with reference to FIG. 4. In particular, as can be seen, the hollow fin 500', which extends from the upper external surface 120, has a plurality of longitudinally-extending fin sections 566' which, in this example, are rectilinear. The hollow fin 500' also has a plurality of looping fin sections 568' each of which interconnects two consecutive ones of the longitudinally-extending fin sections 566'. The longitudinally-extending fin sections 566' extend above the longitudinally-extending sections $266_1$-$266_9$ of the lower fluid conduit portion 260 while the looping fin sections 568' extend above the looping sections $268_1$-$268_8$ of the lower fluid conduit portion 260. In this example, the height of the longitudinally-extending fin sections 566' is greater than the height of the looping fin sections 568'. The heights of the longitudinally-extending fin sections 566' and the looping fin sections 568' may be the same in other embodiments. In this alternative embodiment, the hollow fin 500' defines a continuous internal fin recess 510' that describes the same path as the lower fluid conduit portion 260 and thus overlaps the lower fluid conduit portion 260 along a majority of a span thereof, and more specifically an entirety of the span thereof (rather than only along the longitudinally-extending sections $266_1$-$266_9$). As can be seen in FIG. 23, the internal fin recess 510' has first portions 525' along the longitudinally-extending fin sections 566' and second portions 569' along the looping fin sections 568'. The height of the internal fin recess 510' is greater at the first portions 525' than at the second portions 569'. The height of the internal fin recess 510' may be constant in other embodiments. Furthermore, the single hollow fin 500' defines a plurality of external fin passages 515' for allowing flow of an external fluid (e.g., air or dielectric fluid) therein.

Figure 25:
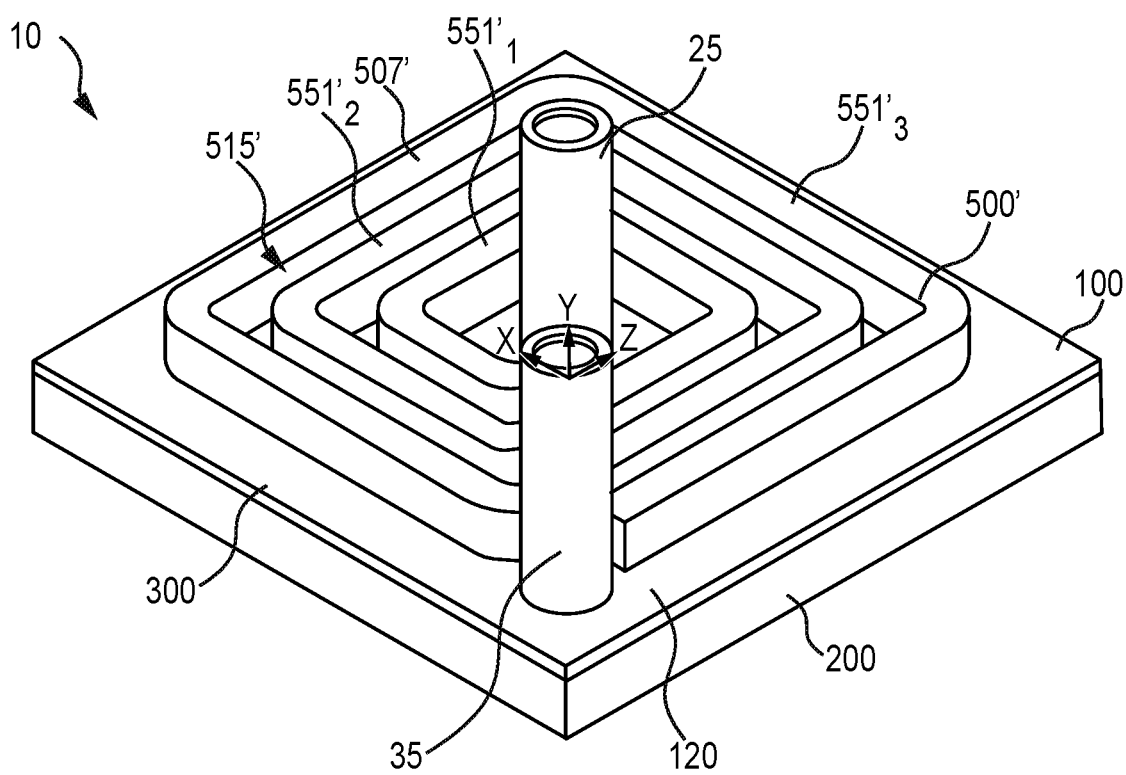
FIG. 25 is a perspective view, taken from a top, front, right side, of the water block according to another alternative embodiment in which the base portion of the water block is the base portion of FIG. 24.
Figure 26:
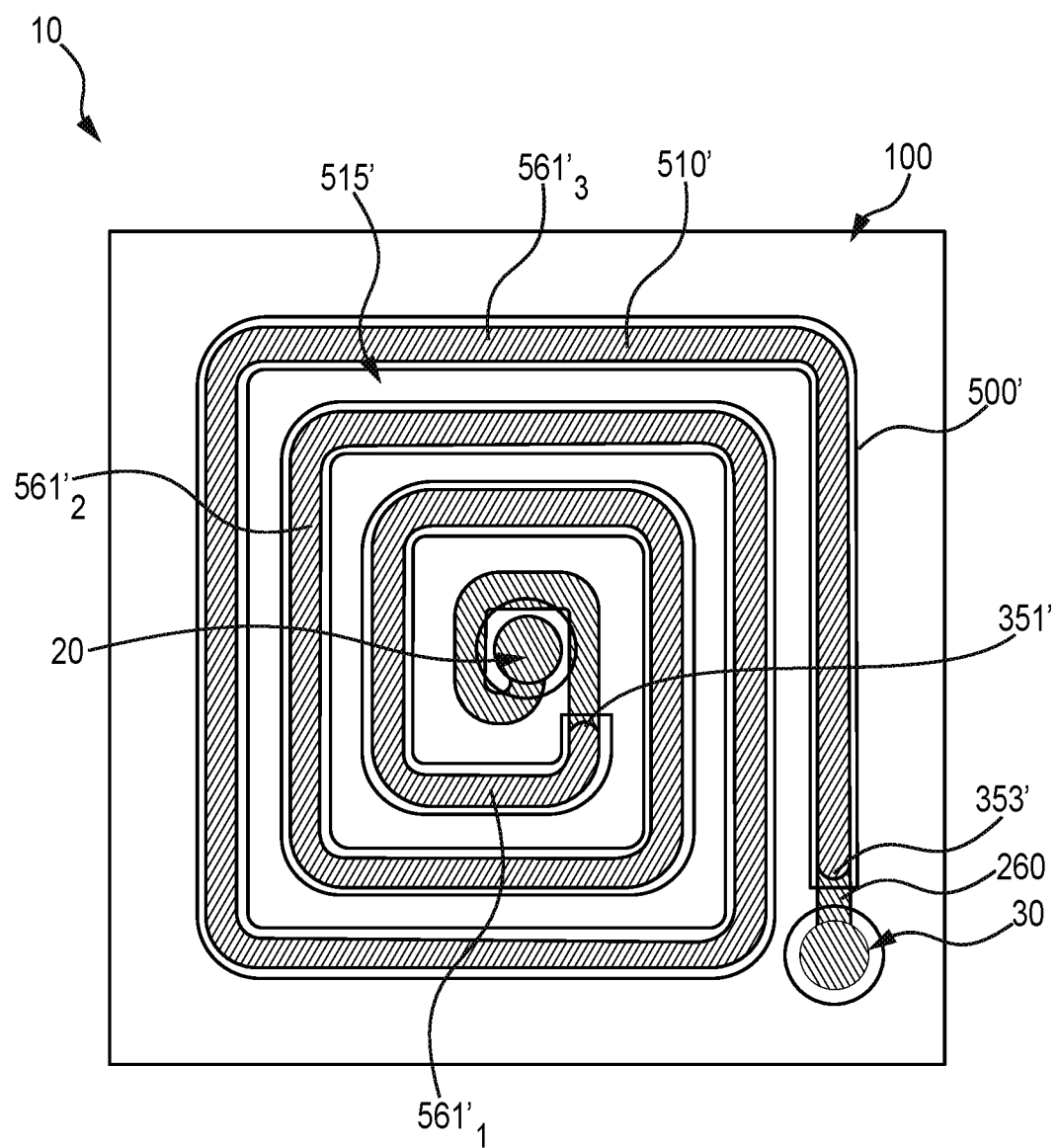
FIG. 26 is a top plan view of the water block of FIG. 25, illustrating the water block translucently to expose the internal fluid conduit.
Figure 27:
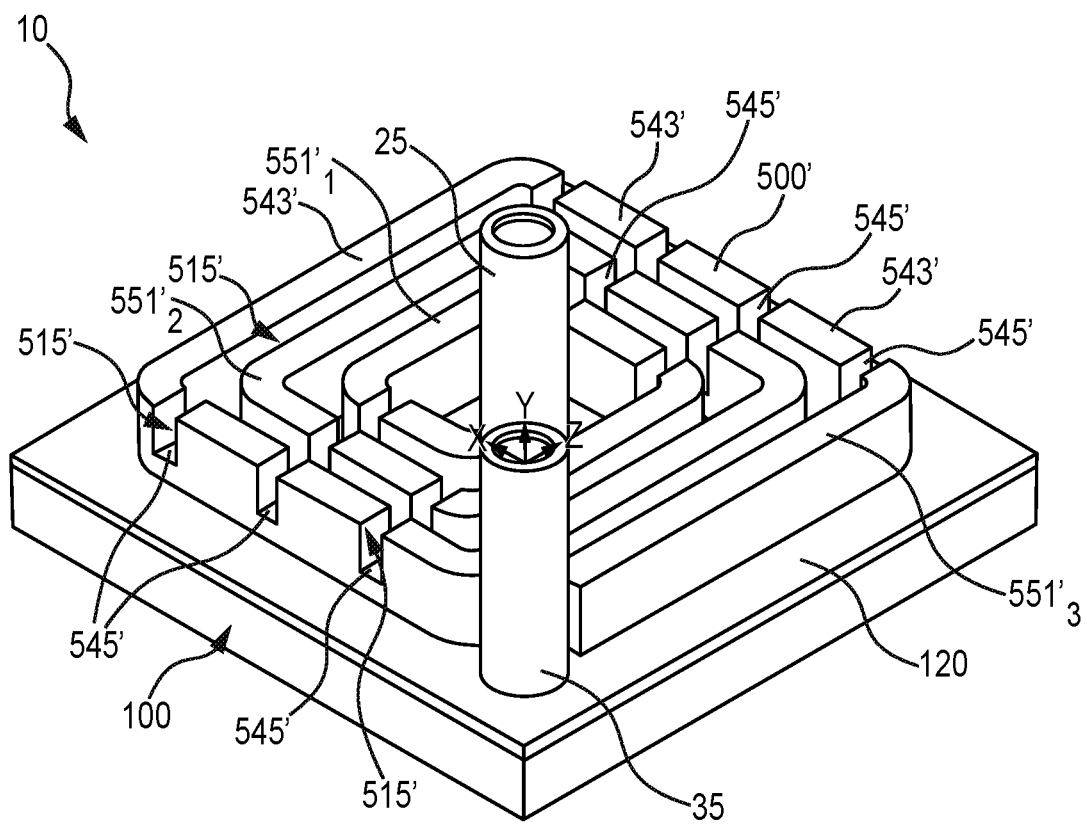
FIG. 27 is a perspective view, taken from a top, front, right side, of the water block according to another alternative embodiment.

In yet another embodiment, with reference to FIGS. 25 and 26, the single hollow fin 500' describes a spiral path matching the spiral path of lower fluid conduit portion 260 shown in FIG. 24. In particular, the hollow fin 500' has a plurality of fin ring sections $551'_1$-$551'_3$ which extend above respective ones of the ring sections $251_2$-$251_4$ such that the hollow fin 500' overlies a majority of the lower fluid conduit portion 260. In particular, as shown in FIG. 26, the continuous internal fin recess 510' of the hollow fin 500' describes a majority of the path of the lower fluid conduit portion 260. Notably, the internal fin recess 510' of the hollow fin 500' has ring recess portions $561'_1$-$561'_3$ that extend along respective ones of the fin ring sections $551'_1$-$551'_3$, with each ring recess portion $561'_1$ being aligned with a corresponding one of the ring sections $251_2$-$251_4$. In this alternative embodiment, the hollow fin 500' defines a continuous external fin passage 515' between consecutive ones of the fin ring sections $551'_1$-$551'_3$. While the hollow fin 500' is illustrated as having a single fin passage 515', additional fin passages 515' may be provided by reducing of portions of the hollow fin 500'. Notably, as shown in FIG. 27, in another embodiment, the spiral hollow fin 500' has full size portions 543' and shortened portions 545'. Along the shortened portions 545', the height of the hollow fin 500' is less than along the full size portions 543'. Some of the shortened portions 545' are aligned with one another in different ones of the fin ring sections $551'_1$-$551'_3$ so as to form longitudinal fin passages 515' through which the external fluid can flow.

It is to be understood that many of the features described with respect to different embodiments of the water block 10 may be combined where they do not contradict one another.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A water block for cooling a heat-generating component, comprising:
   a body defining an internal fluid conduit for circulating a liquid within the water block, the body defining a fluid inlet and a fluid outlet for feeding the liquid into and discharging the liquid from the internal fluid conduit respectively, the body comprising:
   an external thermal transfer surface configured to be in thermal contact with the heat-generating component;
   an opposite external surface disposed in parallel with and on an opposite side of the body from the external thermal transfer surface, the internal fluid conduit comprises a lower fluid conduit portion disposed between the external thermal transfer surface and the opposite external surface, the lower fluid conduit portion configured with a plurality of longitudinally-extending sections that define a path for the liquid to flow through the internal fluid conduit between the fluid inlet and the fluid outlet; and at least one hollow fin extending from the opposite external surface, the at least one hollow fin defining at least one external fin passage and at least one internal fin recess having a longitudinally-extending configuration, wherein, the at least one hollow fin is positioned such that the longitudinally-extending configuration of the at least one internal fin recess is longitudinally overlaid on top of a corresponding section of the plurality of longitudinally-extending sections of the lower fluid conduit portion to matingly form the internal fluid conduit of the water block and enable the fluid liquid flow therethrough.

2. The water block of claim 1, wherein:
the body comprises a base portion and a cover portion affixed to one another, the base portion and the cover portion defining together the internal fluid conduit;
the base portion comprises the external thermal transfer surface; and
the cover portion comprises the opposite external surface.

3. The water block of claim 1, wherein:
the at least one hollow fin includes a plurality of hollow fins;
the hollow fins are generally parallel to one another and are spaced apart from one another, the external fin passages being defined between consecutive ones of the hollow fins.

4. The water block of claim 1, wherein a cross-sectional profile of each hollow fin, taken along a plane normal to a length of the hollow fin, is generally rectangular.

5. The water block of claim 1, wherein the at least one hollow fin is configured to be in thermal contact with an external fluid to transfer heat from the heat transfer fluid circulating in the internal fluid conduit to the external fluid.

6. The water block of claim 3, wherein:
each hollow fin of the plurality of hollow fin extends, in a height direction, from the opposite external surface to an upper end of the hollow fin;
the water block further comprises a fin cover interconnecting the upper ends of the hollow fins; and
each of the fin passages is defined between two consecutive ones of the hollow fins, the opposite external surface and the fin cover.

7. The water block of claim 6, wherein the fin cover extends generally parallel to the opposite external surface.

8. The water block of claim 3, wherein:
each hollow fin of the plurality of hollow fins has a length measured from a first longitudinal end to a second longitudinal end thereof; and
the length of each hollow fin corresponds to at least a majority of a length of the body.

9. The water block of claim 3, wherein:
each hollow fin of the plurality of hollow fins has a length measured from a first longitudinal end to a second longitudinal end thereof; and
the fin recess of each hollow fin of the plurality of hollow fins extends along at least a majority of the length thereof.

10. A heat transfer system for cooling a heat-generating component, the heat transfer system comprising:
the water block of claim 1, the internal fluid conduit of the water block being configured to circulate a first heat transfer liquid therethrough; and
an immersion cooling tank containing the water block therein, the immersion cooling tank being configured to contain a second heat transfer liquid therein such that, in use, the water block is immersed in the second heat transfer liquid such that the second heat transfer liquid flows in the at least one external fin passage defined by the at least one hollow fin of the water block.

11. The heat transfer system of claim 10, wherein the first heat transfer liquid is water and the second heat transfer liquid is a dielectric liquid.

12. A method of installing a heat transfer system for cooling a heat-generating component, the method comprising:
providing an immersion cooling tank;
installing a water block on the heat-generating component, the water block comprising:
an internal fluid conduit for circulating a first heat transfer liquid through the water block;
a plurality of longitudinally-extending internal sections that define a path for flow of the first heat transfer liquid;
at least one hollow fin defining an internal fin recess having a longitudinally-extending configuration that is aligned to be longitudinally overlaid on top a corresponding section of the plurality of longitudinally-extending sections of the lower fluid conduit portion and matingly form the internal fluid conduit and facilitate the internal flow of the first heat transfer liquid therethrough;
placing the heat-generating component and the installed water block in the immersion cooling tank;
pumping the first heat transfer liquid through the internal fluid conduit of the water block; and
filling the immersion cooling tank with a second heat transfer liquid such that the second heat transfer liquid flows within at least one external fin passage defined by the at least one hollow fin thereby transferring thermal energy from the first heat transfer liquid circulating in the internal fin recess of the at least one hollow fin to the second heat transfer liquid.

13. The method of claim 12, wherein the first heat transfer liquid is water.

14. The method of claim 12, wherein the heat-generating component is placed in the immersion cooling tank such that the at least one hollow fin of the water block extends generally vertically.

* * * * *

UNITED STATES PATENT AND TRADEMARK OFFICE
CERTIFICATE OF CORRECTION

| | | |
|---|---|---|
| PATENT NO. | : 12,029,010 B2 | |
| APPLICATION NO. | : 17/677176 | |
| DATED | : July 2, 2024 | |
| INVENTOR(S) | : Ali Chehade et al. | |

It is certified that error appears in the above-identified patent and that said Letters Patent is hereby corrected as shown below:

In the Claims

Column 16, Claim 12, Line 36 should read --is aligned to be longitudinally overlaid on top of a--

Signed and Sealed this
Sixth Day of August, 2024

Katherine Kelly Vidal
*Director of the United States Patent and Trademark Office*